(12) United States Patent
Kim et al.

(10) Patent No.: US 10,365,778 B2
(45) Date of Patent: Jul. 30, 2019

(54) DISPLAY DEVICE

(71) Applicant: SAMSUNG DISPLAY CO., LTD., Yongin-si, Gyeonggi-do (KR)

(72) Inventors: Ji Sun Kim, Yongin-si (KR); Jang Mi Kang, Yongin-si (KR); Il Gon Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 5 days.

(21) Appl. No.: 15/942,958

(22) Filed: Apr. 2, 2018

(65) Prior Publication Data

US 2018/0284927 A1   Oct. 4, 2018

(30) Foreign Application Priority Data

Apr. 3, 2017   (KR) .................. 10-2017-0043088

(51) Int. Cl.
*G06F 3/044* (2006.01)
*H01L 27/32* (2006.01)
*G06F 3/041* (2006.01)

(52) U.S. Cl.
CPC ............ *G06F 3/044* (2013.01); *G06F 3/0412* (2013.01); *H01L 27/323* (2013.01); *H01L 27/3272* (2013.01); *H01L 27/3276* (2013.01)

(58) Field of Classification Search
CPC ............... G02F 1/1345; G02F 1/13452; G02F 2201/123; G02F 2202/16; H01L 27/124; H01L 2227/323; H01L 2251/5315; H01L 27/3262; G06F 3/0412; G06F 3/044

See application file for complete search history.

(56) References Cited

U.S. PATENT DOCUMENTS

| | | | |
|---|---|---|---|
| 9,660,003 B2 | 5/2017 | Sato et al. | |
| 2015/0008400 A1* | 1/2015 | Kim | H01L 27/3279 257/40 |
| 2015/0194634 A1* | 7/2015 | Kang | H01L 51/5268 257/40 |
| 2015/0331508 A1 | 11/2015 | Nho et al. | |
| 2016/0307931 A1* | 10/2016 | Hong | H01L 27/1222 |
| 2017/0052645 A1* | 2/2017 | Hur | G06F 3/0412 |

* cited by examiner

*Primary Examiner* — Gerald Johnson
(74) *Attorney, Agent, or Firm* — Cantor Colburn LLP

(57) ABSTRACT

A display device includes a substrate including a pixel area, and a peripheral area enclosing at least one side of the pixel area, a plurality of pixels provided in the pixel area, each of the plurality of pixels including a light-emitting area from which light is emitted, a light-emitting element which is provided in each of plurality of the pixels and which emits the light, a pixel circuit which is provided in each of the plurality of pixels and which drives the light-emitting element, and a conductive pattern which is disposed between the substrate and the pixel circuit and which overlap the pixel circuit in a plan view. Pixels of the plurality of pixels each may include a sensing unit which is electrically connected to the conductive pattern and which senses a touch of a user.

20 Claims, 10 Drawing Sheets

DISPLAY DEVICE

This application claims priority to Korean patent application No. 10-2017-0043088, filed on Apr. 3, 2017, and all the benefits accruing therefrom under 35 U.S.C. § 119, the content of which in its entirety is herein incorporated by reference.

BACKGROUND

1. Field

Various exemplary embodiments of the invention relate to a display device.

2. Description of Related Art

With an increase in interest in an information display and an increase in demand to use portable information media, demand for display devices is markedly increased, and commercialization thereof is actively in progress.

Particularly, as demand for high resolution of the display devices has increased, a structure of a circuit included in a pixel is gradually complicated while a size of the pixel is gradually reduced.

SUMMARY

Various exemplary embodiments of the invention are directed to a display device having improved reliability.

An exemplary embodiment of the invention provides a display device including a substrate including a pixel area, and a peripheral area enclosing at least one side of the pixel area, a plurality of pixels provided in the pixel area, each of the plurality of pixels comprising a light-emitting area from which light is emitted, a light-emitting element which is provided in each of the plurality of pixels and which emits the light, a pixel circuit which is provided in each of the plurality of pixels and which drives the light-emitting element, and a conductive pattern which is disposed between the substrate and the pixel circuit and which overlaps the pixel circuit in a plan view. Pixels of the plurality of pixels each may include a sensing unit which is electrically connected to the conductive pattern and which senses a touch of a user.

In an exemplary embodiment, the conductive pattern may include a sensing electrode which changes in capacitance in response to a touch of a user.

In an exemplary embodiment, the sensing unit may overlap the conductive pattern in the plan view.

In an exemplary embodiment, the conductive pattern may include a light blocking layer which blocks light from being drawn from a rear surface of the substrate on which the pixel circuit is not disposed.

In an exemplary embodiment, the display device may further include a scan line which transmits a scan signal to each of the plurality of pixels, a data line which transmits a data signal to each of the plurality of pixels, a sensing scan line which is disposed in the same layer as the scan line, and which drives the sensing unit, and a read-out line which is disposed in the same layer as the data line, and which acquires the change in the capacitance of the conductive pattern.

In an exemplary embodiment, the read-out line may be electrically connected to the conductive pattern.

In an exemplary embodiment, the sensing unit may include a sensing transistor which is connected to the sensing scan line and the read-out line and which senses the touch of the user.

In an exemplary embodiment, the sensing transistor may include a sensing active pattern disposed on the substrate, a sensing gate electrode disposed on the sensing active pattern, and a sensing source electrode and a sensing drain electrode connected to the sensing active pattern. The sensing gate electrode may be unitary with the sensing scan line.

In an exemplary embodiment, the conductive pattern may overlap the sensing active pattern in the plan view and block light from being transmitted from a rear surface of the substrate to the sensing active pattern.

In an exemplary embodiment, the display device may further include a buffer layer which is disposed between the conductive pattern and the sensing active pattern, and in which a first contact hole through which a portion of the conductive pattern is exposed is defined.

In an exemplary embodiment, the display device may further include an insulating layer disposed between the sensing active pattern and the read-out line, and including a second contact hole through which a portion of the sensing active pattern is exposed.

In an exemplary embodiment, one of the sensing source electrode and the sensing drain electrode may be electrically connected to the conductive pattern through the first contact hole, and a remaining one thereof may be electrically connected to the read-out line through the second contact hole.

In an exemplary embodiment, the pixel circuit may include a first transistor connected to the scan line and the data line, and a second transistor which is connected to the first transistor and which drives the light-emitting element.

In an exemplary embodiment, each of the first and second transistors may include an active pattern provided over the conductive pattern disposed over the substrate, a gate electrode disposed on the active pattern, and a source electrode and a drain electrode connected to the active pattern.

In an exemplary embodiment, the conductive pattern may overlap the active pattern of each of the first and second transistors in the plan view.

In an exemplary embodiment, the conductive pattern may block light from being transmitted from a rear surface of the substrate to the active pattern.

In an exemplary embodiment, the light-emitting element may include a first electrode disposed on the substrate and connected to the second transistor, a light-emitting layer disposed on the first electrode, and a second electrode disposed on the light-emitting layer.

In an exemplary embodiment, each of the pixels may include a light transmitting area which is provided on at least one side of the light-emitting area and which passes light therethrough.

In an exemplary embodiment, the pixel circuit may not be provided in the light transmitting area.

An exemplary embodiment of the invention provides a display device including a substrate including a pixel area, and a peripheral area enclosing at least one side of the pixel area, a plurality of pixels provided in the pixel area, each of the pixels comprising a light-emitting area from which light is emitted, a light-emitting element which is provided in each of the pixels and which emits the light, a pixel circuit which is provided in each of the pixels and which drives the light-emitting element, a light blocking layer which is disposed between the substrate and the pixel circuit and which blocks light drawn into a rear surface of the substrate from being transmitted to the pixel circuit, and a sensing unit provided in the pixel area and electrically connected to the light blocking layer, the sensing unit which senses a touch of a user. The light blocking layer may include a sensing electrode which changes in capacitance in response to the touch of the user, and overlap each of the pixel circuit and the sensing unit in a plan view.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
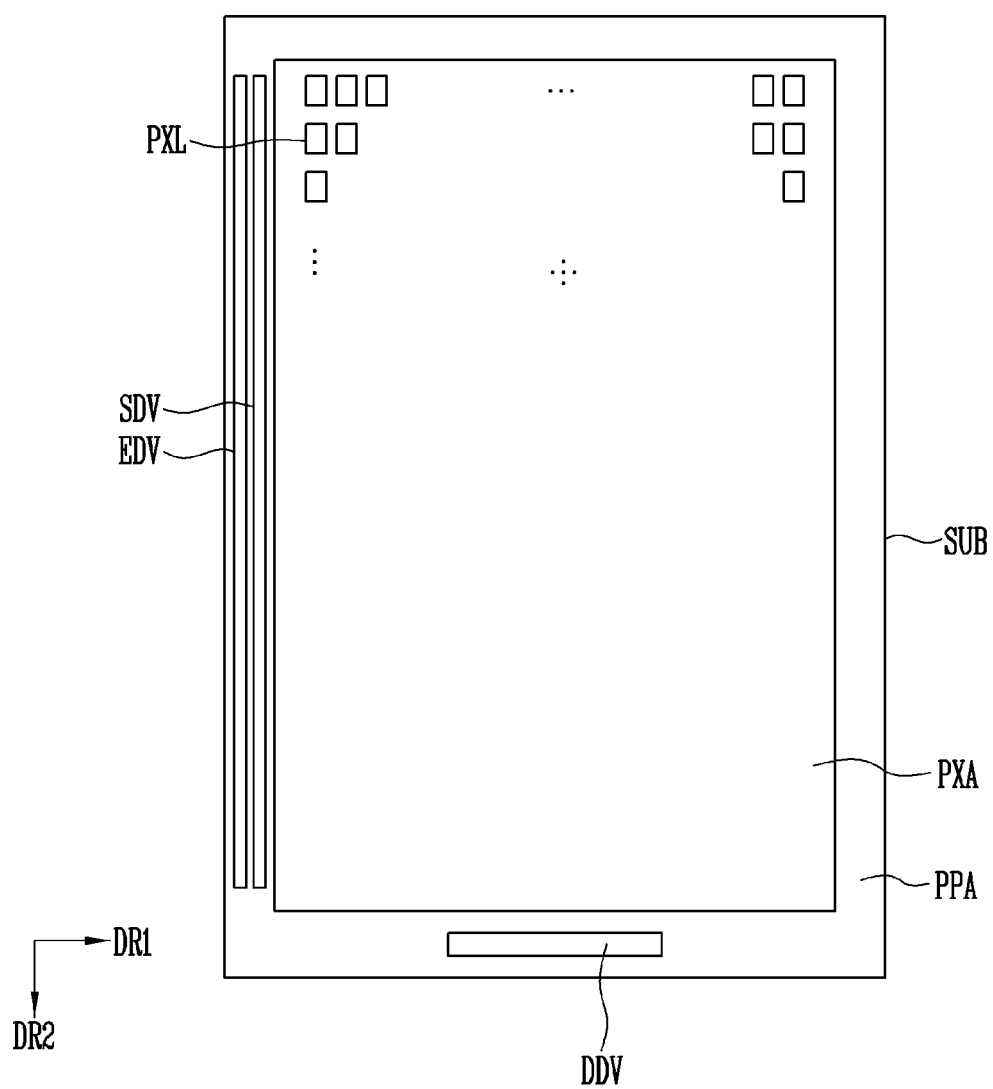
FIG. 1 is a plan view illustrating an exemplary embodiment of a display device in accordance with the invention.

Reference will now be made in detail to various exemplary embodiments of the disclosure, specific examples of which are illustrated in the accompanying drawings and described below, since the exemplary embodiments of the disclosure may be variously modified in many different forms. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various drawing figures and embodiments of the disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a display device in accordance with an exemplary embodiment of the invention will be described with reference to the attached drawings.

FIG. 1 is a plan view illustrating a display device in accordance with an exemplary embodiment of the invention.

Referring to FIG. 1, the display device in accordance with the exemplary embodiment of the invention may include a substrate SUB, pixels PXL which are provided on the substrate SUB, a drive unit which is provided on the substrate SUB and which drives the pixels PXL, and a line unit (not shown) which couples the pixels PXL with the drive unit.

The substrate SUB may include a pixel area PXA, and a peripheral area PPA. The pixel area PXA may be an area in which the pixels PXL for displaying an image are provided. Each pixel PXL will be described later herein. The peripheral area PPA may be a non-display area in which the pixels PXL are not provided and an image is not displayed. The drive unit for driving the pixels PXL, and a part of the line unit (not shown) for coupling the pixels PXL with the drive unit may be provided in the peripheral area PPA. The peripheral area PPA may correspond to a bezel in the final product of the display device. The width of the bezel may be determined depending on the width of the peripheral area PPA.

The pixel area PXA may have various shapes. In an exemplary embodiment, the pixel area PXA may be provided in various forms such as a closed polygon including sides, a circle, an ellipse or the like including a side including a curved line, and a semicircle, a semi-ellipse or the like including sides including a linear line and a curved line, for example. In an exemplary embodiment of the invention, there will be described an example in which the pixel area PXA is provided with a single area having a rectangular shape including linear sides, for example.

The peripheral area PPA may be provided on at least one side of the pixel area PXA. In an exemplary embodiment of the invention, the peripheral area PPA may enclose the periphery of the pixel area PXA. The peripheral area PPA may include a horizontal part which extends in a first direction DR1, and a vertical part which extends in a second direction DR2 intersecting the first direction DR1. The vertical part of the peripheral area PPA may comprise a pair of vertical parts which are spaced apart from each other with respect to the transverse direction of the pixel area PXA.

The pixels PXL may be provided in the pixel area PXA on the substrate SUB. Each pixel PXL refers to a smallest unit for displaying an image, and a plurality of pixels may be provided. The pixels PXL may include a display element which emits white light and/or other color light.

The pixels PXL may be arranged in a matrix form along rows extending in the first direction DR1 and columns extending in the second direction DR2. However, the arrangement of the pixels PXL is not limited to a particular arrangement. In other words, the pixels PXL may be arranged in various forms. In an exemplary embodiment, some of the pixels PXL may be arranged such that the first direction DR1 is the row direction, but the remaining pixels PXL may be arranged such that a direction other than the first direction DR1, e.g., a direction oblique to the first direction DR1, is the row direction, for example. In an alternative exemplary embodiment, the pixels PXL may be arranged such that a direction oblique to the first and second directions DR1 and DR2 is the column direction, and a direction interesting the column direction is the row direction. Here, the column direction may be oblique to the first and second directions DR1 and DR2.

Figure 2:
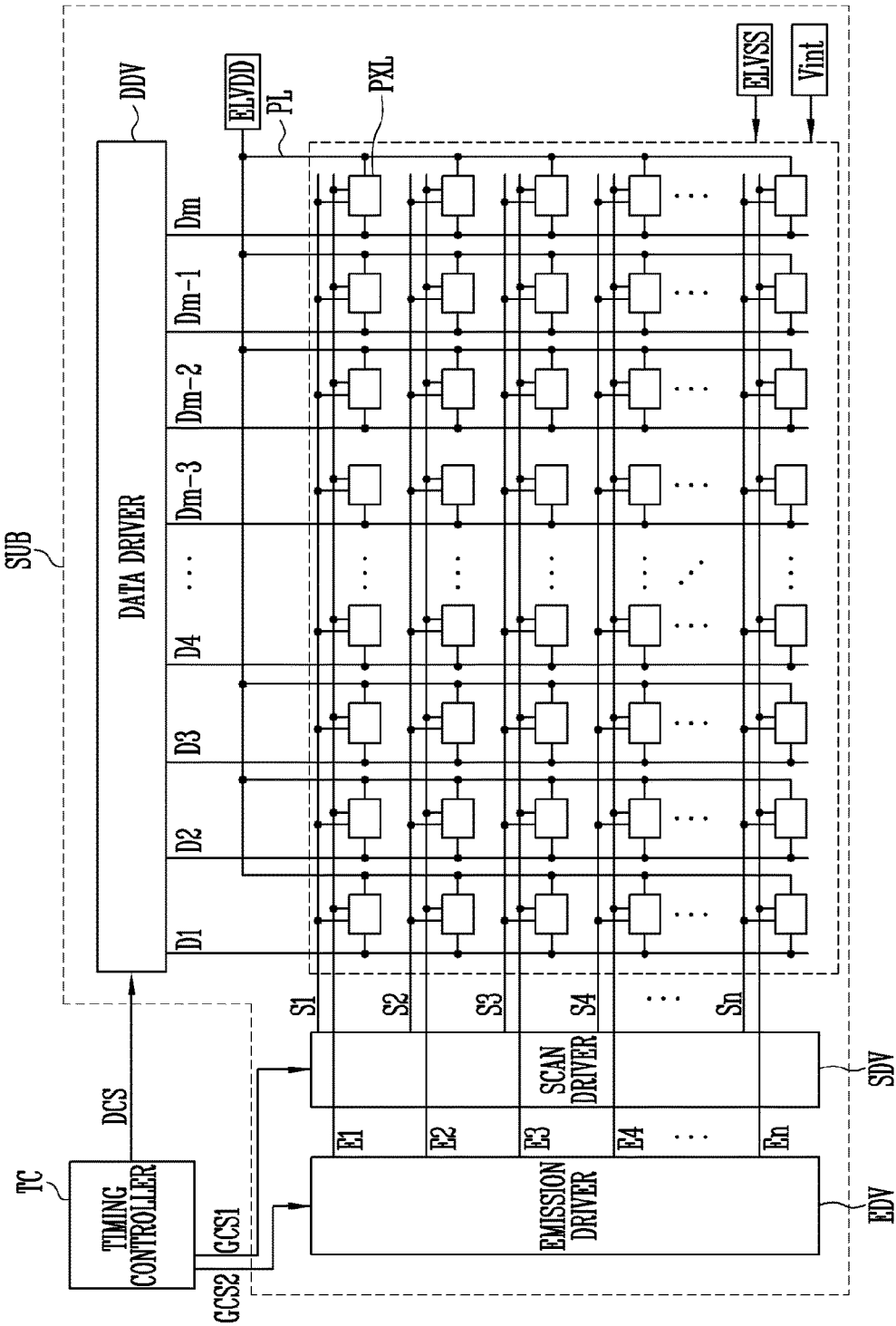
FIG. 2 is a block diagram illustrating an exemplary embodiment of pixels and a drive unit in the display device of FIG. 1.

The drive unit may include a scan driver SDV which provides scan signals to respective pixels PXL through scan lines S1 to Sn (refer to FIG. 2), an emission driver EDV which provides emission control signals to respective pixels PXL through emission control lines E1 to En (refer to FIG. 2), a data driver DDV which provides data signals to respective pixels PXL through data lines D1 to Dm (refer to FIG. 2), and a timing controller TC (refer to FIG. 2). The timing controller TC may control the scan driver SDV, the emission driver EDV, and the data driver DDV.

The scan driver SDV may be disposed in at least one of the vertical parts of the peripheral area PPA. The scan driver SDV may extend a predetermined length in the longitudinal direction of the peripheral area PPA, but the invention is not limited thereto.

In an exemplary embodiment of the invention, the scan driver SDV may be directly disposed (e.g., mounted) on the substrate SUB. In the case where the scan driver SDV is directly disposed (e.g., mounted) on the substrate SUB, the scan driver SDV may be provided together with the pixels PXL during a process of forming the pixels PXL. However, the location at which the scan driver SDV is disposed or the method of providing the scan driver SDV is not limited thereto. In an exemplary embodiment, the scan driver SDV may be provided on a separate chip and then disposed (e.g., mounted) on the substrate SUB in a chip-on-glass manner, for example. Alternatively, the scan driver SDV may be disposed (e.g., mounted) on a printed circuit board and then coupled to the substrate SUB by a connector.

The emission driver EDV may also be disposed in at least one of the vertical parts of the peripheral area PPA in a manner similar to that of the scan driver SDV. The emission driver EDV may extend a predetermined length in the longitudinal direction of the peripheral area PPA.

In an exemplary embodiment of the invention, although there has been illustrated an example in which the scan driver SDV and the emission driver EDV are disposed adjacent to each other and provided in only one side of the vertical parts of the peripheral area PPA, the invention is not limited thereto. The arrangement of the scan driver SDV and the emission driver EDV may be changed in various ways.

The data driver DDV may be disposed in the peripheral area PPA. Particularly, the data driver DDV may be disposed in the horizontal part of the peripheral area PPA, for example. The data driver DDV may extend a predetermined length in the transverse direction of the peripheral area PPA. However, the invention is not limited thereto, and in other exemplary embodiment, the data driver DDV may be disposed in various other parts.

FIG. 2 is a block diagram illustrating an exemplary embodiment of the pixels and the drive unit in the display device of FIG. 1.

Referring to FIGS. 1 and 2, the display device in accordance with an exemplary embodiment of the invention may include pixels PXL, a drive unit, and a line unit.

In an exemplary embodiment, a plurality of pixels PXL may be provided. Each pixel PXL, which refers to a smallest unit for displaying an image, may include a display element which emits light. In an exemplary embodiment, the display element may include any one of a liquid crystal display ("LCD") element, an electrophoretic display ("EPD") element, an electrowetting display ("EWD") element, and an organic light-emitting display ("OLED") element, for example. In an exemplary embodiment of the invention, for the sake of explanation, the OLED element will be described as an example of the display element.

Each pixel PXL may emit light having any one color among red, green, and blue, but the invention is not limited thereto. In an exemplary embodiment, each pixel PXL may emit light having a color such as cyan, magenta, yellow, or white, for example.

The drive unit may include a scan driver SDV, an emission driver EDV, a data driver DDV, and a timing controller TC. The locations of the scan driver SDV, the emission driver EDV, the data driver DDV, and the timing controller TC shown in FIG. 2 are only for illustrative purposes, and may be disposed at other locations in an actual display device.

Figure 5:
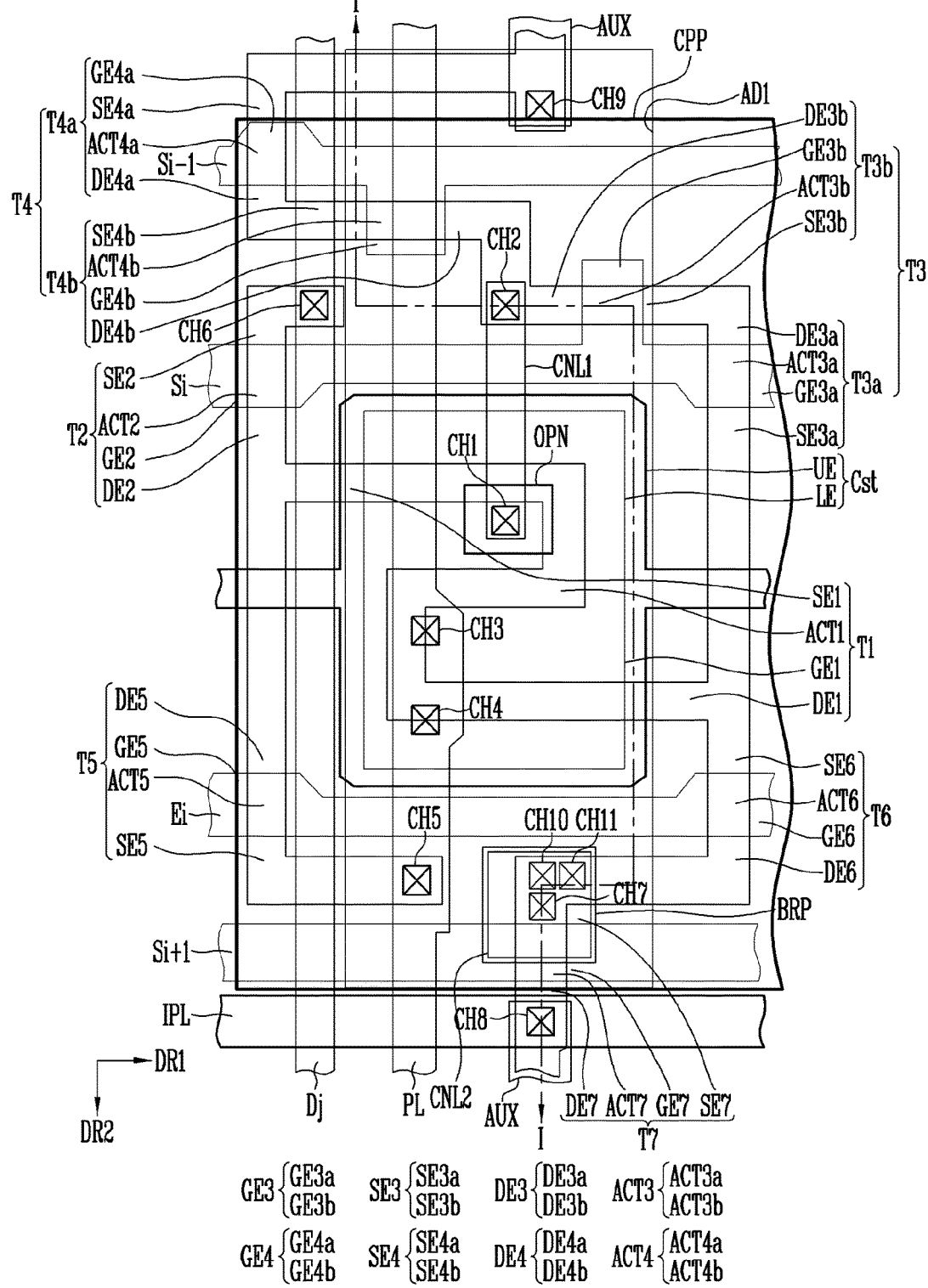
FIG. 5 is a plan view illustrating in detail a first sub-pixel circuit shown in FIGS. 3 and 4.

The line unit may provide a signal from the drive unit to each pixel PXL and include scan lines S1 to Sn, data lines D1 to Dm, emission control lines E1 to En, a power line PL, and an initialization power line IPL (refer to FIG. 5). Here, n and m are natural numbers.

The pixels PXL may be disposed in the pixel area PXA. The pixels PXL may be coupled to the scan lines S1 to Sn, the emission control lines E1 to En, the data lines D1 to Dm, and the power line PL. The pixels PXL may be supplied with a data signal from the data lines D1 to Dm when a scan signal is supplied from the scan lines S1 to Sn.

The pixels PXL may be supplied with a first power supply ELVDD, a second power supply ELVSS, and an initialization power supply Vint from external devices. Here, the first power supply ELVDD may be supplied to the pixels PXL through the power lines PL.

Each of the pixels PXL may include a drive transistor and a display element, which are not illustrated. In response to the data signal, the drive transistor may control the amount of current flowing from the first power supply ELVDD to the second power supply ELVSS via the display element. Before the data signal is supplied to each pixel PXL, a gate electrode of the drive transistor may be initialized by the voltage of the initialization power supply Vint. In this regard, the initialization power supply Vint may be set to a voltage lower than that of the data signal.

The scan driver SDV may supply the scan signal to the scan lines S1 to Sn in response to a first gate control signal GCS1 supplied from the timing controller TC. In an exemplary embodiment, the scan driver SDV may sequentially supply the scan signal to the scan lines S1 to Sn, for example. When the scan signal is sequentially supplied to the scan lines S1 to Sn, the pixels PXL may be sequentially selected on a horizontal line basis.

The emission driver EDV may supply the emission control signal to the emission control lines E1 to En in response to a second gate control signal GCS2 supplied from the timing controller TC. In an exemplary embodiment, the emission driver EDV may sequentially provide the emission control signal to the emission control lines E1 to En, for example. The emission control signal may be set to have a width greater than that of the scan signal.

The data driver DDV may supply the data signal to the data lines D1 to Dm in response to a data control signal DCS. The data signal supplied to the data lines D1 to Dm may be supplied to the pixels PXL selected by the scan signal.

The timing controller TC may supply the first gate control signal GSC1, generated based on timing signals supplied from an external device, to the scan driver SDV, supply the second gate control signal GCS2 to the emission drivers EDV, and supply the data control signal DCS to the data driver DDV.

Each of the first and second gate control signals GCS1 and GCS2 may include a start pulse and clock signals. The start pulse may control a timing of a first scan signal or a first emission control signal. The clock signals may be used to shift the start pulse.

The data control signal DCS may include a source start pulse and clock signals. The source start pulse may control the time at which the sampling of data starts. The clock signals may be used to control a sampling operation.

Figure 3:
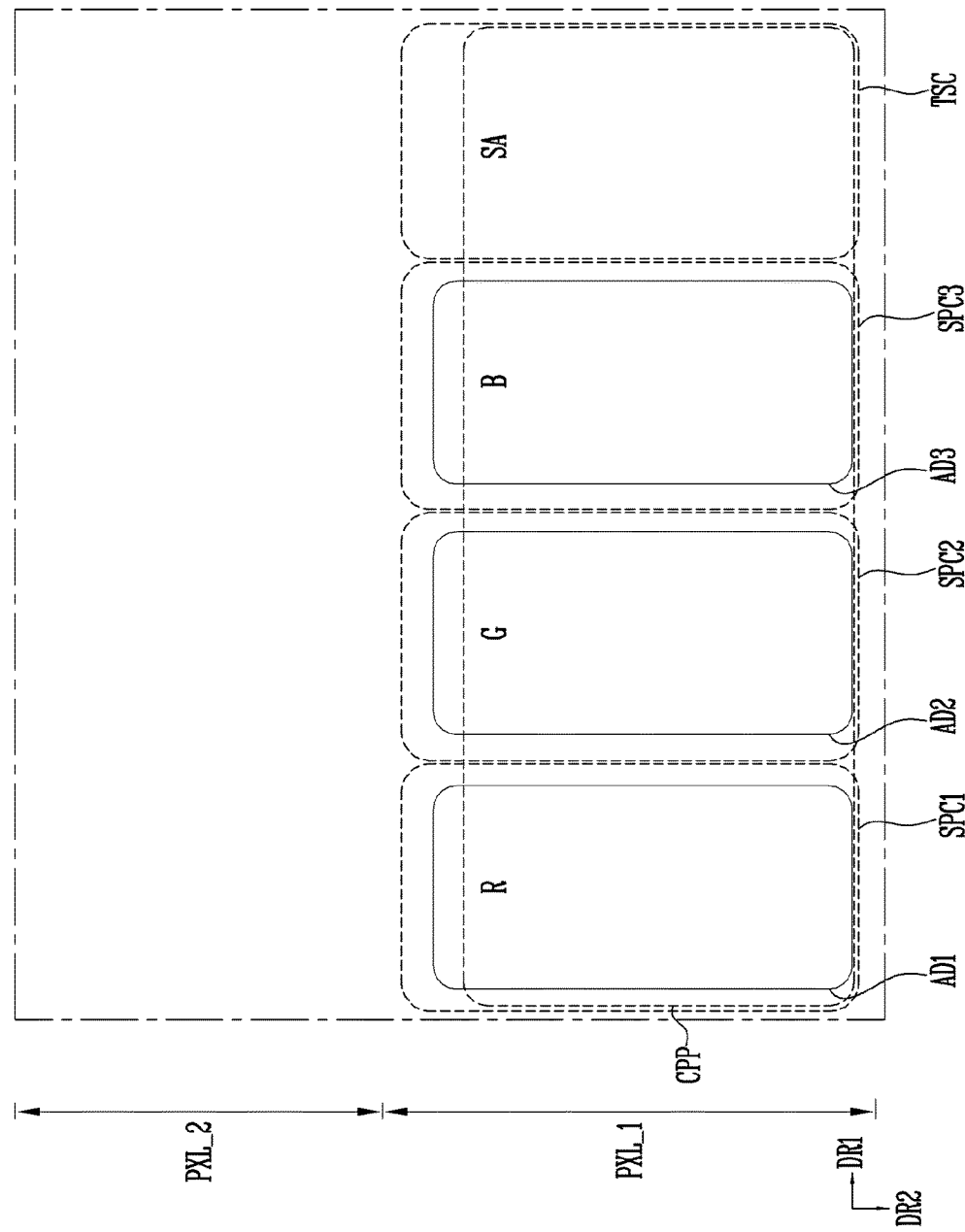
FIG. 3 is a schematic plan view illustrating one of pixels shown in FIG. 1.

FIG. 3 is a schematic plan view illustrating one of the pixels shown in FIG. 1. In FIG. 3, for the sake of explanation, each pixel PXL has been illustrated as including three sub-pixels, but the invention is not limited thereto.

Referring to FIGS. 1 and 3, the pixel PXL in accordance with an exemplary embodiment of the invention may include a first area PXL_1 from which light is emitted, and a second area PXL_2 through which light passes.

The first area PXL_1 may be a light-emitting area from which light is emitted, and may include first to third sub-pixels.

The first sub-pixel may include a first light-emitting area R from which light having a first color is emitted, and a first sub-pixel circuit SPC1 which drives the first light-emitting area R. The second sub-pixel may include a second light-emitting area G from which light having a second color is emitted, and a second sub-pixel circuit SPC2 which drives the second light-emitting area G. The third sub-pixel may include a third light-emitting area B from which light having a third color is emitted, and a third sub-pixel circuit SPC3 which drives the third light-emitting area B.

The first to third colors may be different colors. In an exemplary embodiment, the first color may be red, the second color may be green, and the third color may be blue, for example, but the invention is not limited thereto. In an exemplary embodiment, any one of the first to third colors may be white, magenta, yellow, or cyan, for example.

The first sub-pixel circuit SPC1 may be electrically coupled to a 1-1-th electrode AD1. The second sub-pixel circuit SPC2 may be electrically coupled to a 1-2-th electrode AD2. The third sub-pixel circuit SPC3 may be electrically coupled to a 1-3-th electrode AD3.

The 1-1-th electrode AD1 may correspond to the first light-emitting area R. The 1-2-th electrode AD2 may correspond to the second light-emitting area G. The 1-3-th electrode AD3 may correspond to the third light-emitting area B.

The first area PXL_1 of each pixel PXL may further include a sensing area SA provided to sense a touch of a user. A touch sensing circuit TSC may be disposed in the sensing area SA. The touch sensing circuit TSC may sense a touch of the user using a sensing electrode and thus recognize the location of the touch of the user. The touch sensing circuit TSC will be described later in more detail with reference to FIGS. 7 and 8.

In an exemplary embodiment of the invention, for the sake of explanation, there has been illustrated an example in which the touch sensing circuit TSC is disposed on each pixel PXL, but the invention is not limited thereto. In an exemplary embodiment, the touch sensing circuit TSC may be disposed on only some of the pixels PXL, while the touch sensing circuit TSC may not be disposed on the remaining pixels PXL, for example.

Furthermore, a conductive pattern CPP may be disposed in the first area PXL_1 of each pixel PXL.

In a plan view, the conductive pattern CPP may extend in the first direction DR1 and have a bar shape, but the invention is not limited thereto. In a plan view, the conductive patter CPP may overlap the first to third sub-pixel circuits SPC1, SPC2, and SPC3 and the touch sensing circuit TSC.

In an exemplary embodiment, the conductive pattern CPP may include conductive material, e.g., metal. The conductive pattern CPP may include one kind of metal or, alternatively, may include two or more kinds of metals, or an alloy of two or more kinds of metals. The conductive pattern CPP may be a light blocking layer which blocks light drawn into a rear surface of the substrate SUB, thus preventing the light from entering the first, second, or third sub-pixel circuit SPC1, SPC2, or SPC3.

The second area PXL_2 of each pixel PXL may be an area other than the first area PXL_1 and may be a light transmitting area allowing light to pass therethrough.

Figure 4:
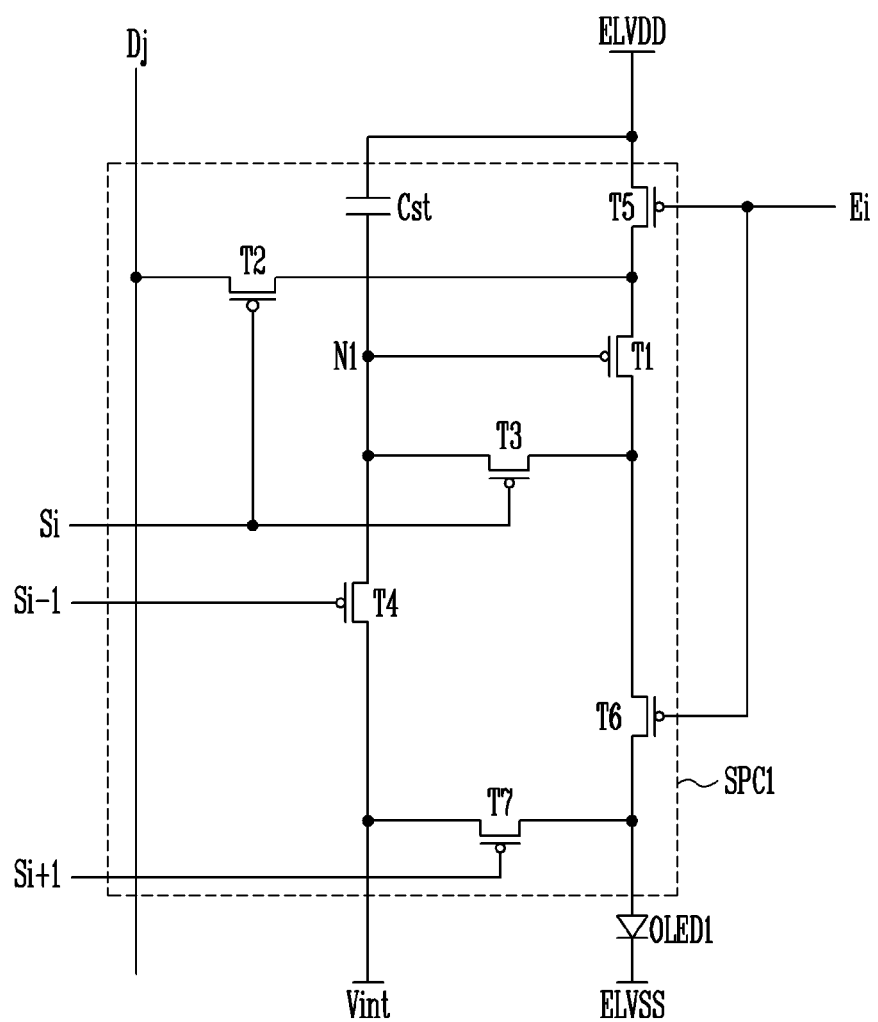
FIG. 4 is an equivalent circuit diagram illustrating a first sub-pixel circuit shown in FIG. 3.

FIG. 4 is an equivalent circuit diagram illustrating the first sub-pixel circuit SPC1 shown in FIG. 3. For the sake of explanation, the illustration in FIG. 4 is focused on a first sub-pixel circuit that is coupled to a j-th data line Dj, an i−1-th scan line Si−1, an i-th scan line Si, and an i+1-th scan line Si+1. Here, j is a natural number equal to or less than m, and i is a natural number less than n.

Referring to FIGS. 3 and 4, the first sub-pixel circuit SPC1 in accordance with an exemplary embodiment of the invention may include first to seventh transistors T1 to T7 and a storage capacitor Cst. The first sub-pixel circuit SPC1 may be electrically coupled to a first display element OLED1 so as to drive the first display element OLED1. The display element OLED1 may be an organic light emitting diode. For the sake of explanation, hereinafter, the first display element OLED1 will be also referred to as a first organic light-emitting diode.

A 1-1-th electrode AD1 of the first organic light-emitting diode OLED1 may be coupled to the first transistor T1 via the sixth transistor T6, and a second electrode thereof may be coupled to a second power supply ELVSS. The first organic light-emitting diode OLED1 may generate light having a predetermined luminance corresponding to current supplied from the first transistor TR1.

The seventh transistor TR7 may be coupled between the initialization power supply Vint and the 1-1-th electrode AD1 of the first organic light-emitting diode OLED1. A gate electrode of the seventh transistor T7 may be coupled to an i+1-th scan line Si+1. When a scan signal is supplied to the i+1-th scan line Si+1, the seventh transistor T7 may be turned on so that the voltage of the initialization power supply Vint may be supplied to the 1-1-th electrode AD1 of the first organic light-emitting diode OLED1.

A first electrode of the first transistor T1 (also referred to as drive transistor) may be coupled to the first power supply ELVDD via the fifth transistor T5, and a second electrode thereof may be coupled to the 1-1 electrode AD1 of the first organic light-emitting diode OLED1 via the sixth transistor T6. A gate electrode of the first transistor T1 may be coupled to a first node N1. The first transistor T1 may control, in response to the voltage of the first node N1, current flowing from the first power supply ELVDD to the second power supply ELVSS via the first organic light-emitting diode OLED1.

The third transistor T3 may be coupled between the second electrode of the first transistor T1 and the first node N1. A gate electrode of the third transistor T3 may be coupled to an i-th scan line Si. When a scan signal is supplied to the i-th scan line Si, the third transistor T3 is turned on so that the second electrode of the first transistor T1 may be electrically coupled with the first node N1. Therefore, when the third transistor T3 is turned on, the first transistor T1 may be connected in the form of a diode.

The fourth transistor T4 may be coupled between the first node N1 and the initialization power supply Vint. A gate electrode of the fourth transistor T4 may be coupled to the i-1-th scan line Si-1. When a scan signal is supplied to the i-1-th scan line Si-1, the fourth transistor T4 is turned on so that the voltage of the initialization power supply Vint may be supplied to the first node N1.

The second transistor T2 may be coupled between the j-th data line Dj and the first electrode of the first transistor T1. A gate electrode of the second transistor T2 may be coupled to an i-th scan line Si. When a scan signal is supplied to the i-th scan line Si, the second transistor T2 is turned on so that the first electrode of the first transistor T1 may be electrically coupled with the j-th data line Dj.

The storage capacitor Cst may be coupled between the first power supply ELVDD and the first node N1. The storage capacitor Cst may store a voltage corresponding both to the data signal of the j-th data line Dj and to a threshold voltage of the first transistor T1.

Figure 6:
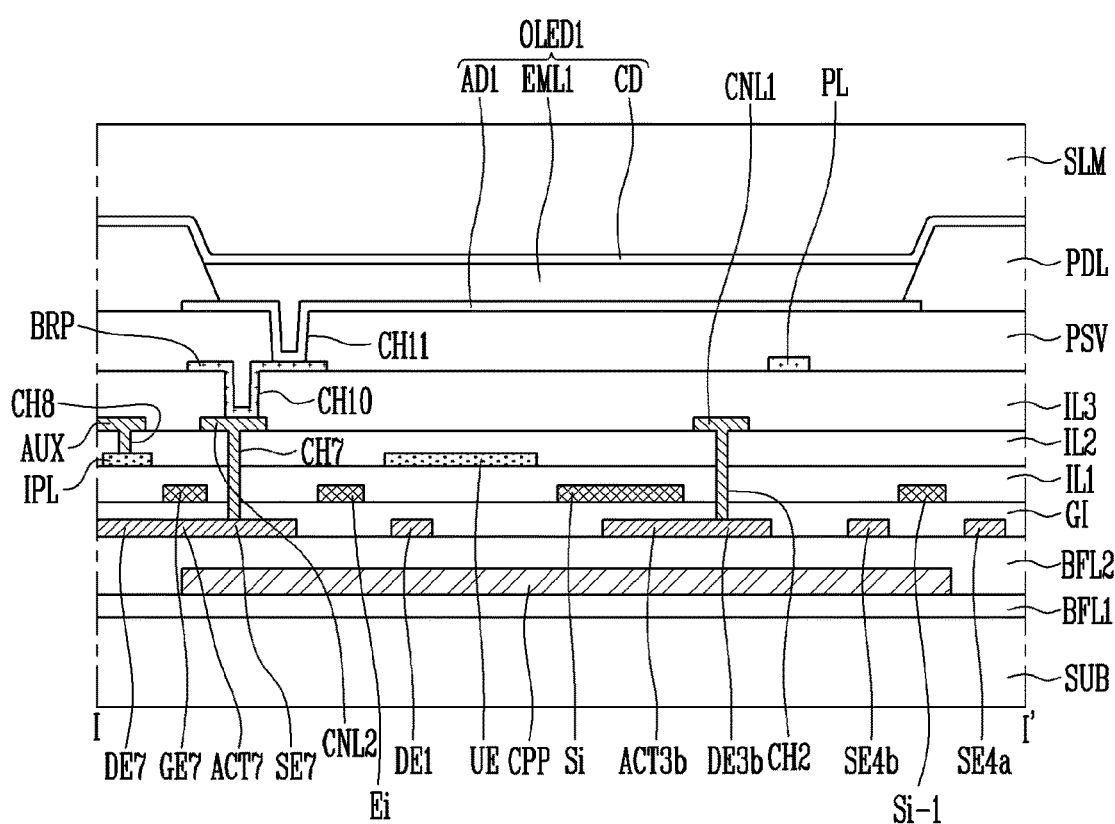
FIG. 6 is a cross-sectional view taken along line I-I' of FIG. 5.

FIG. 5 is a plan view illustrating in detail the first sub-pixel circuit SPC1 shown in FIGS. 3 and 4. FIG. 6 is a cross-sectional view taken along line I-I' of FIG. 5.

In FIGS. 5 and 6, based on a first sub-pixel disposed on an i-th row and a j-th column in the pixel area, there are illustrated three scan lines Si-1, Si, and Si+1, an emission control line Ei, a power line PL, and a data line Dj which are coupled to the first sub-pixel. In FIGS. 5 and 6, for the sake of description, a scan line of the i-1-th row refers to "i-1-th scan line Si-1", a scan line of the i-th row refers to "i-th scan line Si", a scan line of the i+1-th row refers to "i+1-th scan line Si+1", an emission control line of the i-th row refers to "emission control line Ei", a data line of the j-th column refers to "data line Dj", and a j-th power line and an initialization power line respectively refer to "power line PL" and "initialization power line IPL".

Referring to FIGS. 3 to 6, the display device in accordance with an exemplary embodiment of the invention may include a substrate SUB, a line unit, and pixels PXL (refer to FIG. 1).

The substrate SUB may include transparent insulating material to allow light transmission. The substrate SUB may be a rigid substrate. In an exemplary embodiment, the substrate SUB may be at least one of a glass substrate, a quartz substrate, a glass ceramic substrate, and a crystalline glass substrate, for example.

The substrate SUB may be a flexible substrate. Here, the substrate SUB may be either a film substrate or a plastic substrate which includes polymer organic material. In an exemplary embodiment, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate, for example. However, materials constituting the substrate SUB are not limited thereto, and include, for example, fiber reinforced plastic ("FRP").

The line unit may provide signals to the pixels PXL and include scan lines Si-1, Si, and Si+1, data lines Dj, emission control lines Ei, a power line PL, and an initialization power line IPL.

The scan lines Si-1, Si and Si+1 may include an i-1-th scan line Si-1, an i-th scan line Si, and an i+1-th scan line Si+1 which extend in the first direction DR1 and are successively arranged in the second direction DR2 intersecting the first direction DR1. An i-1-th scan signal may be applied to the i-1-th scan line Si-1. An i-th scan signal may be applied to the i-th scan line Si. An i+1-th scan signal may be applied to the i+1-th scan line Si+1.

The data lines Dj may extend in the second direction DR2 and be successively arranged in the first direction DR1. Data signals may be applied to the data lines Dj.

The power line PL may extend in the second direction DR2 and be disposed at a position spaced apart from the corresponding data line Dj. First power supply ELVDD may be applied to the power line PL.

The initialization power line IPL may be disposed between the data line Dj and the power line PL that extend in the second direction DR2. Initialization power supply Vint may be applied to the initialization power line IPL.

Each pixel PXL may include first to third sub-pixels, but the invention is not limited thereto. In an exemplary embodiment, each pixel PXL may include more sub-pixels such as first to fourth sub-pixels or first to fifth sub-pixels, for example. For the sake of description, in an exemplary embodiment of the invention, each pixel PXL will be described as including the first to third sub-pixels.

The first sub-pixel may include a first sub-pixel circuit SPC1, and a first organic light-emitting diode OLED1 coupled to the first sub-pixel circuit SPC1. The second sub-pixel may include a second sub-pixel circuit SPC2 (refer to FIG. 10), and a second organic light-emitting diode (not shown) coupled to the second sub-pixel circuit SPC2. The third sub-pixel may include a third sub-pixel circuit SPC3 (refer to FIG. 10), and a third organic light-emitting diode (not shown) coupled to the third sub-pixel circuit SPC3. Each of the first to third sub-pixel circuits SPC1, SPC2, and SPC3 may include first to seventh transistors T1 to T7 and a storage capacitor Cst.

Hereinafter, for the sake of convenient description, the first sub-pixel circuit SPC1 and the first organic light-emitting device OLED1 coupled to the first sub-pixel circuit SPC1 will be described as a representative example.

The first sub-pixel circuit SPC1 may include first to seventh transistors T1 to T7 and a storage capacitor Cst.

The first transistor T1 may include a first gate electrode GE1, a first active pattern ACT1, a first source electrode SE1, a first drain electrode DE1, and a first contact line CNL1.

The first gate electrode GE1 may be coupled with a third drain electrode DE3 of the third transistor T3 and a fourth drain electrode DE4 of the fourth transistor T4. The first contact line CNL1 may couple the first gate electrode GE1, the third drain electrode DE3, and the fourth drain electrode DE4 to each other. A first end of the first contact line CNL1 is coupled with the first gate electrode GE through a first contact hole CH1. A second end of the first contact line CNL1 may be coupled with the third drain electrode DE3 and the fourth drain electrode DE4 through a second contact hole CH2.

The first active pattern ACT1 may overlap the first gate electrode GE1 in a plan view. Since the first active pattern ACT1 is relatively long, a channel area of the first transistor T1 may also be relatively long. Thus, a driving range of a gate voltage to be applied to the first transistor T1 may be increased. Consequently, the gradation of light which is emitted from the OLED may be precisely controlled.

In an exemplary embodiment of the invention, each of the first active pattern ACT1, the first source electrode SE1, and the first drain electrode DE1 may include an undoped semiconductor layer or a semiconductor layer doped with an impurity. In an exemplary embodiment, each of the first source electrode SE1 and the first drain electrode DE1 may include a semiconductor layer doped with an impurity, for example. The first active pattern ACT1 may include an undoped semiconductor layer.

The first source electrode SE1 may be coupled to a first end of the first active pattern ACT1. The first source electrode SE1 may be coupled with a second drain electrode DE2 of the second transistor T2 and a fifth drain electrode DE5 of the fifth transistor T5. The first drain electrode DE1 may be coupled to a second end of the first active pattern ACT1. The first drain electrode DE1 may be coupled with a third source electrode SE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be coupled to the i-th scan line Si. The second active pattern ACT2 may include an undoped semiconductor layer. A first end of the second source electrode SE2 may be coupled to the second active pattern ACT2. A second end of the second source electrode SE2 may be coupled to the data line Dj through a sixth contact hole CH6. A first end of the second drain electrode DE2 may be coupled with the second active pattern ACT2. A second end of the second drain electrode DE2 may be coupled with the first source electrode SE1 of the first transistor T1 and the fifth drain electrode DE5 of the fifth transistor T5.

The third transistor T3 may have a double gate structure to prevent current leakage. In other words, the third transistor T3 may include a 3a-th transistor T3a, and a 3b-th transistor T3b. The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b. Hereinbelow, the 3a-th gate electrode GE3a and the 3b-th gate electrode GE3b will be also referred to as "third gate electrode GE3". The 3a-th active pattern ACT3a and the 3b-th active pattern ACT3b will be also referred to as "third active pattern ACT3". The 3a-th source electrode SE3a and the 3b-th source electrode SE3b will be also referred to as "third source electrode SE3". The 3a-th drain electrode DE3a and the 3b-th drain electrode DE3b will be also referred to as "third drain electrode DE3".

The third gate electrode GE3 may be coupled to the i-th scan line Si. The third active pattern ACT3 may include an undoped semiconductor layer. A first end of the third source electrode SE3 may be coupled to the third active pattern ACT3. A second end of the third source electrode SE3 may be coupled with the first drain electrode DE1 of the first transistor T1 and the sixth source electrode SE6 of the sixth transistor T6. A first end of the third drain electrode DE3 may be coupled to the third active pattern ACT3. A second end of the third drain electrode DE3 may be coupled to the fourth drain electrode DE4 of the fourth transistor T4. The third drain electrode DE3 may be coupled to the first gate electrode GE1 of the first transistor T1 by the first contact line CNL1 through the second contact hole CH2 and the first contact hole CH1.

The fourth transistor T4 may have a double gate structure to prevent current leakage. In other words, the fourth transistor T4 may include a 4a-th transistor T4a, and a 4b-th transistor T4b. The 4a-th transistor T4a may include a 4a-th gate electrode GE4a, a 4a-th active pattern ACT4a, a 4a-th source electrode SE4a, and a 4a-th drain electrode DE4a. The 4b-th transistor T4b may include a 4b-th gate electrode GE4b, a 4b-th active pattern ACT4b, a 4b-th source electrode SE4b, and a 4b-th drain electrode DE4b. Hereinbelow, the 4a-th gate electrode GE4a and the 4b-th gate electrode GE4b will be also referred to as "fourth gate electrode GE4". The 4a-th active pattern ACT4a and the 4b-th active pattern ACT4b will be also referred to as "fourth active pattern ACT4". The 4a-th source electrode SE4a and the 4b-th source electrode SE4b will be also referred to as "fourth source electrode SE4". The 4a-th drain electrode DE4a and the 4b-th drain electrode DE4b will be also referred to as "fourth drain electrode DE4".

The fourth gate electrode GE4 may be coupled to the i−1-th scan line Si−1. The fourth active pattern ACT4 may include an undoped semiconductor layer. A first end of the fourth source electrode SE4 may be coupled to the fourth active pattern ACT4. A second end of the fourth source electrode SE4 may be coupled to an initialization power line (not shown) of a sub-pixel of an i−1-th row and a seven drain electrode (not shown) of a seventh transistor (not shown) of the sub-pixel of the i−1-th row. A first end of the fourth drain electrode DE4 may be coupled to the fourth active pattern ACT4. A second end of the fourth drain electrode DE4 may be coupled to the third drain electrode DE3 of the third transistor T3. The fourth drain electrode DE4 may also be coupled to the first gate electrode GE1 of the first transistor T1 by the first contact line CNL1 through the second contact hole CH2 and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be coupled to the emission control line Ei. The fifth active pattern ACT5 may include an undoped semiconductor layer. A first end of the fifth source electrode SE5 may be coupled to the fifth active pattern ACT5. A second end of the fifth source electrode SE5 may be coupled to the power line PL through a fifth contact hole CH5. A first end of the fifth drain electrode DE5 may be coupled to the fifth active pattern ACT5. A second end of the fifth drain electrode DE5 may be coupled with the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be coupled to the emission control line Ei. The sixth active pattern ACT6 may include an undoped semiconductor layer. A first end of the sixth source electrode SE6 may be coupled to the sixth active pattern ACT6. A second end of the sixth source electrode SE6 may be coupled with the first drain electrode DE1 of the first transistor T1 and the third source electrode SE3 of the third transistor T3. A first end of the sixth drain electrode DE6 may be coupled to the sixth active pattern ACT6. A second end of the sixth drain electrode DE6 may be coupled to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be coupled to the i+1-th scan line Si+1. The seventh active pattern ACT7 may include an undoped semiconductor layer. The seventh active pattern ACT7 may correspond to a portion of the seventh transistor T7 that overlaps the seventh gate electrode GE7. A first end of the seventh source electrode SE7 may be coupled to the seventh active pattern ACT7. A second end of the seventh source electrode SE7 may be coupled to the sixth drain electrode DE6 of the sixth transistor T6. A first end of the seventh drain electrode DE7 may be coupled to the seventh active pattern ACT7. A second end of the seventh drain electrode DE7 may be coupled to the initialization power line IPL. Furthermore, the seventh drain electrode DE7 may be coupled to a fourth source electrode (not shown) of a fourth transistor (not shown) of a pixel PXL disposed on the i+1-th row. The seventh drain electrode DE7 may be coupled with the fourth source electrode of the fourth transistor of the sub-pixel disposed on the i+1-th row by an auxiliary coupling line AUX through an eighth contact hole CH8 and a ninth contact hole CH9.

The storage capacitor Cst may include a lower electrode LE and an upper electrode UE. The lower electrode LE may include the first gate electrode GE1 of the first transistor T1.

The upper electrode UE may overlap the first gate electrode GE1, and cover the lower electrode LE in a plan view. The capacity of the storage capacity Cst may be increased by increasing an overlapping area between the upper electrode UE and the lower electrode LE. The upper electrode UE may extend in the first direction DR1. In an exemplary embodiment of the invention, a voltage having the same level as that of the first power supply ELVDD may be applied to the upper electrode UE. An opening OPN may be defined in the upper electrode UE in an area in which the first contact hole CH1 through which the first gate electrode GE1 is coupled with the first contact line CNL1 is defined.

The first organic light-emitting diode OLED1 may include a 1-1-th electrode AD1, a second electrode CD, and a first light-emitting layer EML1 provided between the 1-1-th electrode AD1 and the second electrode CD.

The 1-1-th electrode AD1 may be provided in the first light-emitting area R corresponding to the first sub-pixel. The 1-1-th electrode AD1 may be coupled to the seventh source electrode SE7 of the seventh transistor T7 and the sixth drain electrode DE6 of the sixth transistor T6 through a seventh contact hole CH7 and a tenth contact hole CH10. Here, a second contact line CNL2 and a bridge pattern BRP may be provided between the seventh contact hole CH7 and the tenth contact hole CH10 so that the sixth drain electrode DE6 and the seventh source electrode SE7 may be electrically coupled with the 1-1-th electrode AD1.

The first sub-pixel may further include a conductive pattern CPP. The conductive pattern CPP may cover the first sub-pixel circuit SPC1, and may overlap the first sub-pixel circuit SPC1 in a plan view. Particularly, the conductive pattern CPP may overlap the first to seventh transistors T1 to T7 included in the first sub-pixel circuit SPC1. The conductive pattern CPP may cover the first to seventh transistors T1 to T7 so as to prevent light drawn from the rear surface of the substrate SUB from being transmitted to the first to seventh transistors T1 to T7. In other words, the conductive pattern CPP may be a light blocking layer.

Hereinafter, the configuration of the display device according to an exemplary embodiment of the invention will be described in a stacking sequence with reference to FIGS. 5 and 6.

A first buffer layer BFL1 may be provided on the substrate SUB.

The conductive pattern CPP may be provided on the first buffer layer BFL1. In an exemplary embodiment, the conductive pattern CPP may include conductive material, e.g., metal.

A second buffer layer BFL2 may be provided on the conductive pattern CPP.

The first to seventh active patterns ACT1 to ACT7 (hereinafter, also referred to as "active pattern ACT") may be provided on the second buffer layer BFL2. The active pattern ACT may include semiconductor material.

A gate insulating layer GI may be provided on the substrate SUB on which the active pattern ACT has been provided.

The i−1-th scan line Si−1, the i-th scan line Si, and the i+1-th scan line Si+1, the emission control line Ei, and the first to seventh gate electrodes GE1 to GE7 may be provided on the gate insulating layer GI. The first gate electrode GE1 may be the lower electrode LE of the storage capacity Cst. The second gate electrode GE2 and the third gate electrode GE3 may be unitary with the i-th scan line Si. The fourth gate electrode GE4 may be unitary with the i−1-th scan line Si−1. The fifth gate electrode GE5 and the sixth gate electrode GE6 may be unitary with the emission control line Ei. The seventh gate electrode GE7 may be unitary with the i+1-th scan line Si+1.

A first insulating layer IL1 may be provided on the substrate SUB on which the i-1-th scan line Si-1, etc., is disposed.

The upper electrode UE of the storage capacitor Cst and the initialization power line IPL may be provided on the first insulating layer IL1. The upper electrode UE may cover the lower electrode LE. The upper electrode UE may form the storage capacitor Cst along with the lower electrode LE, with the first insulating layer IL1 interposed between the upper and lower electrodes UE and LE.

A second insulating layer IL2 may be provided on the substrate SUB on which the upper electrode UE and the initialization power line IPL have been disposed.

The data line Dj, the power line PL, the first and second contact lines CNL1 and CNL2, and the auxiliary coupling line AUX may be provided on the second insulating layer IL2.

The data line Dj may be coupled to the second source electrode SE2 through the sixth contact hole CH6 that successively passes through the gate insulating layer GI, and the first and second insulating layers IL1 and IL2.

The power line PL may be coupled to the upper electrode UE of the storage capacitor Cst through the third and fourth contact holes CH3 and CH4 that pass through the second insulating layer IL2. The power line PL may also be coupled to the fifth source electrode SE5 through the fifth contact hole CH5 that successively passes through the gate insulating layer GI, and the first and second insulating layers IL1 and IL2.

The first contact line CNL1 may be coupled to the first gate electrode GE1 through the first contact hole CH1 that successively passes through the first and second insulating layers IL1 and IL2. The first contact line CNL1 may be coupled to the third drain electrode DE3 and the fourth drain electrode DE4 through the second contact hole CH2 that successively passes through the gate insulating layer GI, and the first and second insulating layers IL1 and IL2.

The second contact line CNL2 may be a pattern which is provided between the sixth drain electrode DE6 and the 1-1-th electrode AD1 as a medium which couples the sixth drain electrode DE6 and the 1-1-th electrode AD1 to each other. The second contact line CNL2 may be coupled to the sixth drain electrode DE6 and the seventh source electrode SE7 through the seventh contact hole CH7 that successively passes through the gate insulating layer GI, the first and second insulating layers IL1 and IL2.

The auxiliary coupling line AUX may be coupled to the initialization power line IPL through the eighth contact hole CH8 that passes through the second insulating layer IL2. The auxiliary coupling line AUX may be coupled both to the fourth source electrode SE4 and to the seventh drain electrode DE7 of the sub-pixel disposed on the i-1-th row, through the ninth contact hole CH9 that successively passes through the gate insulating layer GI, and the first and second insulating layers IL1 and IL2.

A third insulating layer IL3 may be provided on the substrate SUB on which the data line Dj, etc., is disposed.

The bridge pattern BRP may be provided on the third insulating layer IL3. The bridge pattern BRP may be coupled to the second contact line CNL2 through the tenth contact hole CH10 that passes through the third insulating layer IL3.

A protective layer PSV may be provided on the substrate SUB on which the bridge pattern BRP has been disposed.

The 1-1-th electrode AD1 may be provided on the protective layer PSV. The 1-1-th electrode AD1 may be coupled to the bridge pattern BRP through an eleventh contact hole CH11 passing through the protective layer PSV. Since the bridge pattern BRP is coupled to the second contact line CNL2 through the tenth contact hole CH10, the 1-1-th electrode AD1 may be eventually coupled to the sixth drain electrode DE6 and the seventh source electrode SE7 through the bridge pattern BRP and the second contact line CNL2.

A pixel defining layer PDL suitable for defining the first light-emitting area R may be provided on the substrate SUB on which the 1-1-th electrode AD1 is disposed. The pixel defining layer PDL may expose an upper surface of the 1-1-th electrode AD1 and protrude from the substrate SUB along the periphery of the first light-emitting area R. The pixel defining layer PDL may include organic insulating material.

The first light-emitting layer EML1 may be provided in the first light-emitting area R enclosed by the pixel defining layer PDL. The second electrode CD may be provided on the first light-emitting layer EML1.

An encapsulation layer SLM covering the second electrode CD may be provided on the second electrode CD. The encapsulation layer SLM may prevent oxygen or water from permeating the first organic light-emitting diode OLED1. The encapsulation layer SLM may include a plurality of inorganic layers and a plurality of organic layers. In an exemplary embodiment, the encapsulation layer SLM may include a plurality of unit encapsulation layers including an inorganic layer and an organic layer disposed on the inorganic layer, for example.

In the exemplary embodiment of the invention, there has been described an example in which the encapsulation layer SLM is used to isolate the first organic light-emitting diode OLED1 from the external environment, but the invention is not limited thereto. In an exemplary embodiment, an encapsulation substrate in lieu of the encapsulation layer SLM may be used to isolate the first organic light-emitting diode OLED1 from the external environment, for example. In the case where the encapsulation substrate is used to isolate the first organic light-emitting diode OLED1 from the external environment, the encapsulation layer SLM may be omitted.

Figure 7:
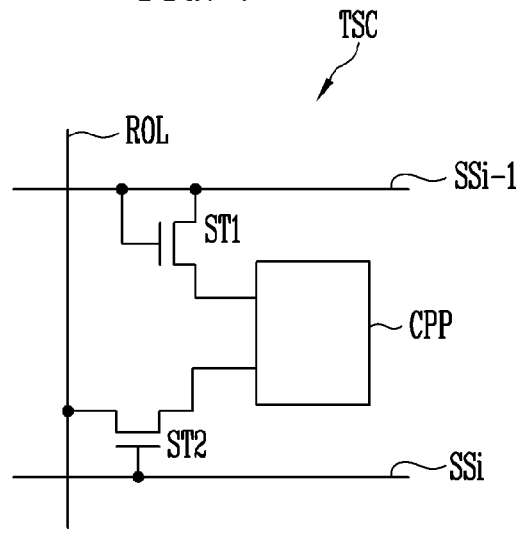
FIG. 7 is an equivalent circuit diagram illustrating a touch sensing circuit shown in FIG. 3.

FIG. 7 is an equivalent circuit diagram illustrating a touch sensing circuit shown in FIG. 3.

Referring to FIGS. 3 and 7, a touch sensing circuit TSC in accordance with an exemplary embodiment of the invention may include first and second sensing transistors ST1 and ST2. In FIG. 7, there has been illustrated an example where the first and second sensing transistors ST1 and ST2 are NMOS transistors, but the invention is not limited thereto. In an exemplary embodiment, each of the first and second sensing transistors ST1 and ST2 may include a PMOS transistor, for example. In an exemplary embodiment of the invention, there will be described the case where each of the first and second sensing transistors ST1 and ST2 includes an NMOS transistor.

A gate electrode of the first sensing transistor ST1 may be coupled to an i-1-th sensing scan line SSi-1. A first electrode of the first sensing transistor ST1 may be coupled to the i-1-th sensing scan line SSi-1, and a second electrode thereof may be coupled to the conductive pattern CPP. The first electrode may be any one of a source electrode and a drain electrode, and the second electrode may be the other electrode. In an exemplary embodiment of the invention, the first electrode may be a source electrode, and the second electrode may be a drain electrode. However, the invention is not limited thereto. In an exemplary embodiment, the first electrode may be a drain electrode, and the second electrode may be source electrode, for example.

When an i-1-th sensing scan signal is supplied to the i-1-th sensing scan line SSi-1, the first sensing transistor ST1 may be turned on and supply the i–1-th sensing scan signal to the conductive pattern CPP. Here, the conductive pattern CPP may store a voltage corresponding to the i–1-th sensing scan signal. The i–1-th sensing scan signal may be a preset signal which initializes the conductive pattern CPP.

A gate electrode of the second sensing transistor ST2 may be coupled to an i-th sensing scan line SSi. A first electrode of the second sensing transistor ST2 may be coupled to a read-out line ROL, and a second electrode thereof may be coupled to the conductive pattern CPP. The first electrode may be any one of a source electrode and a drain electrode, and the second electrode may be the other electrode of the source electrode and the drain electrode. In an exemplary embodiment of the invention, the first electrode may be a source electrode, and the second electrode may be a drain electrode. However, the invention is not limited thereto. In an exemplary embodiment, the first electrode may be a drain electrode, and the second electrode may be source electrode, for example. When an i-th sensing scan signal is supplied, the second sensing transistor ST2 may be turned on and supply the voltage stored in the conductive pattern CPP to the read-out line ROL.

The conductive pattern CPP may be a sensing electrode which varies in self-capacitance depending on a touch generated by the user. When the touch is inputted to the conductive pattern CPP, the capacitance of a touched area of the conductive pattern CPP may vary. Thereby, the voltage stored in the conductive pattern CPP may be changed. A signal corresponding to such a voltage change may be provided to an external sensing circuit (not shown) through the read-out line ROL when the second sensing transistor ST2 is turned on. The external sensing circuit may sense the location and the pressure of the touch using the voltage change.

In the exemplary embodiment of the invention, the touch sensing circuit TSC has been described as including the two sensing transistors ST1 and ST2, but the invention is not limited thereto. In another exemplary embodiment, the touch sensing circuit TSC may include a single sensing transistor and a capacitor or, alternatively, may include three or more sensing transistors and two or more capacitors, for example.

In the exemplary embodiment of the invention, the touch sensing circuit TSC has been described as being a touch sensing element for sensing the location and the pressure of a touch of the user, but the invention is not limited thereto. In an exemplary embodiment, the touch sensing circuit TSC may be a fingerprint sensor which recognizes the fingerprint of the user, for example.

Figure 8:
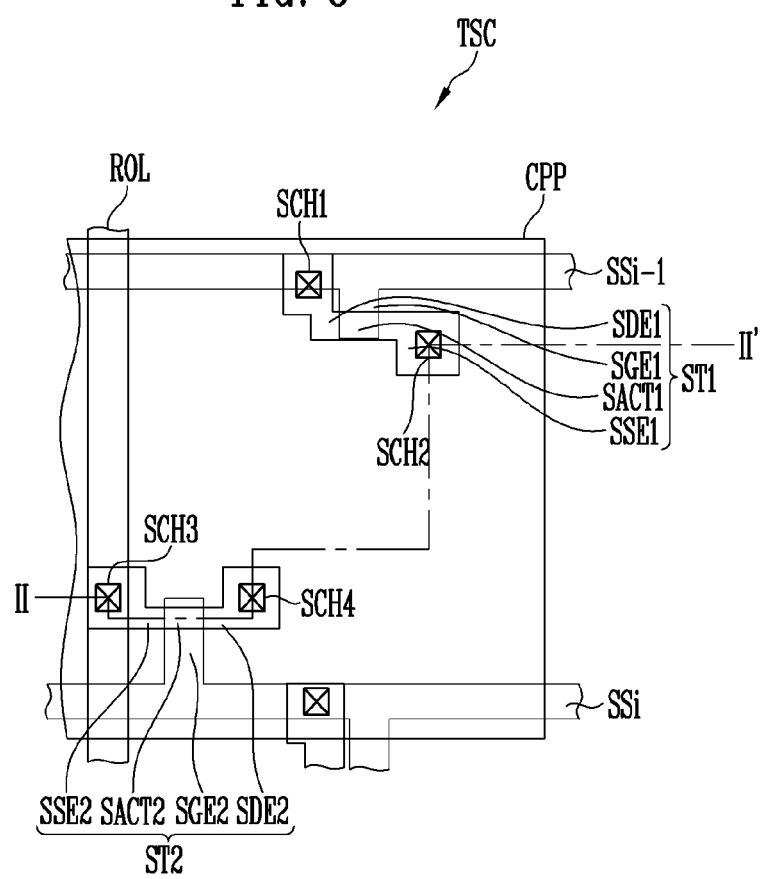
FIG. 8 is a plan diagram illustrating in detail the touch sensing circuit shown in FIG. 7.
Figure 9:
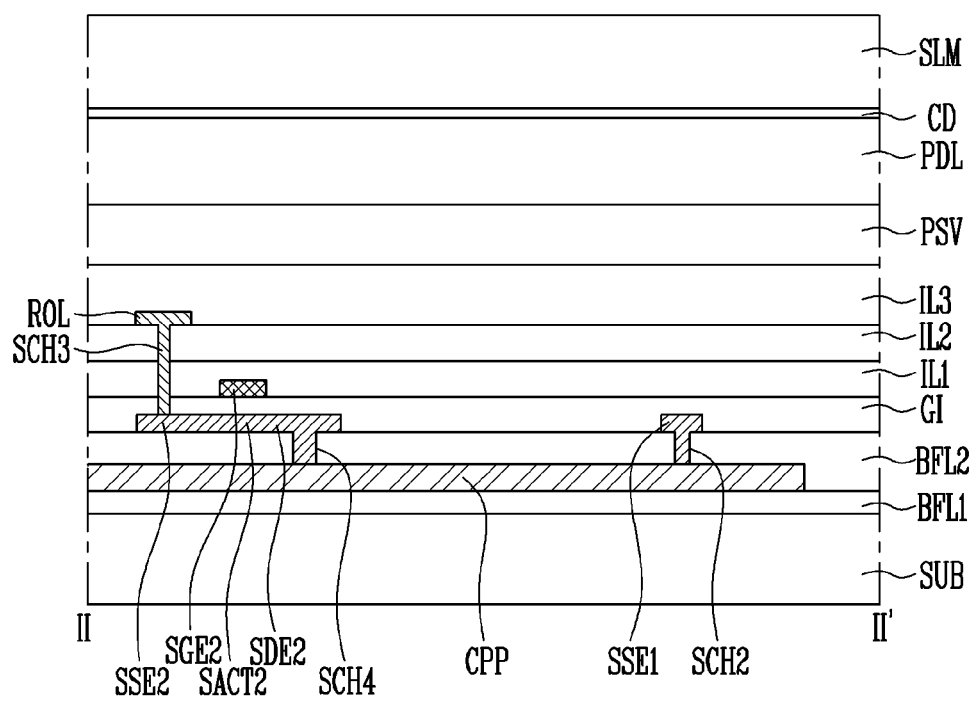
FIG. 9 is a cross-sectional view taken along line II-II' of FIG. 8.

FIG. 8 is a plan diagram illustrating in detail the touch sensing circuit TSC shown in FIG. 7. FIG. 9 is a cross-sectional view taken along line II-II' of FIG. 8.

The illustration in FIGS. 8 and 9 is focused on the sensing scan lines SSi–1 and SSi and the read-out line ROL that are coupled to the sensing touch circuit TSC included in a pixel disposed on the i-th row and the j-th column in the pixel area. In FIGS. 8 and 9, for the sake of description, a sensing scan line disposed on the i–1-th row will be referred to as "i–1-th sensing scan line", a sensing scan line disposed on the i-th row will be referred to as "i-th sensing scan line", and a read-out line disposed on the j-th column will be referred to as "read-out line ROL".

Referring to FIGS. 7 and 9, the touch sensing circuit TSC in accordance with an exemplary embodiment of the invention may include first and second sensing transistors ST1 and ST2, and a line unit. The first and second sensing transistors ST1 and ST2 may be electrically coupled to the conductive pattern CPP.

The line unit may provide a signal to the touch sensing circuit TSC, and may include sensing scan lines SSi–1 and SSi, and a read-out line ROL.

The sensing scan lines SSi–1 and SSi may include an i–1-th sensing scan line SSi–1 and an i-th sensing scan line SSi which extend in the first direction DR1 and are successively arranged in the second direction DR2 intersecting the first direction DR1. An i–1-th sensing scan signal may be applied to the i–1-th sensing scan line SSi–1. An i-th sensing scan signal may be applied to the i-th sensing scan line SSi.

The read-out line ROL may extend in the second direction DR2 and be coupled to an external sensing circuit (not shown). The read-out line ROL may be coupled to the conductive pattern CPP through the second sensing transistor ST2 so that a signal outputted from the conductive pattern CPP may be transmitted to the external sensing circuit.

The first sensing transistor ST1 may include a first sensing gate electrode SGE1, a first sensing active pattern SACT1, a first sensing source electrode SSE1, and a first sensing drain electrode SDE1.

The first sensing gate electrode SGE1 may be provided as a part of the i–1-th sensing scan line SSi–1 or have a shape protruding from the i–1-th sensing scan line SSi–1. In an exemplary embodiment of the invention, each of the first sensing active pattern SACT1, the first sensing source electrode SSE1, and the first sensing drain electrode SDE1 may include an undoped semiconductor layer or a semiconductor layer doped with an impurity. In an exemplary embodiment, each of the first sensing source electrode SSE1 and the first sensing drain electrode SDE1 may include a semiconductor layer doped with an impurity, for example. The first sensing active pattern SACT1 may include an undoped semiconductor layer. The first sensing active pattern SACT1 may correspond to a portion of the first sensing transistor ST1 that overlaps the first sensing gate electrode SGE1. A first end of the first sensing source electrode SSE1 may be coupled to the first sensing active pattern SACT1, and a second end thereof may be coupled to the conductive pattern CPP through a second sensing contact hole SCH2. A first end of the first sensing drain electrode SDE1 may be coupled to the first sensing active pattern SACT1, and a second end thereof may be coupled to the i–1-th sensing scan line SSi–1 through a first sensing contact hole SCH1.

The second sensing transistor ST2 may include a second sensing gate electrode SGE2, a second sensing active pattern SACT2, a second sensing source electrode SSE2, and a second sensing drain electrode SDE2.

The second sensing gate electrode SGE2 may be coupled to the i-th sensing scan line SSi. The second sensing gate electrode SGE2 may be provided as a part of the i-th sensing scan line SSi or have a shape protruding from the i-th sensing scan line SSi. In an exemplary embodiment of the invention, each of the second sensing active pattern SACT2, the second sensing source electrode SSE2, and the second sensing drain electrode SDE2 may include an undoped semiconductor layer or a semiconductor layer doped with an impurity. In an exemplary embodiment, each of the second sensing source electrode SSE2 and the second sensing drain electrode SDE2 may include a semiconductor layer doped with an impurity, for example. The second sensing active pattern SACT2 may include an undoped semiconductor layer. The second sensing active pattern SACT2 may correspond to a portion of the second sensing transistor ST2 that overlaps the second sensing gate electrode SGE2. A first end of the second sensing source electrode SSE2 may be coupled to the second sensing active pattern SACT2, and a second end thereof may be coupled to the read-out line ROL through a third sensing contact hole SCH3. A first end of the second sensing drain electrode SDE2 may be coupled to the second sensing active pattern SACT2, and a second end thereof may be coupled to the conductive pattern CPP through a fourth sensing contact hole SCH4.

The conductive pattern CPP may be electrically coupled to the first and second sensing transistors ST1 and ST2, and may cover the touch sensing circuit TSC. The conductive pattern CPP may overlap the touch sensing circuit TSC in a plan view. Particularly, the conductive pattern CPP may overlap the first and second sensing transistors ST1 and ST2. The conductive pattern CPP may cover the first and second sensing transistors ST1 and ST2 so as to prevent light drawn from the rear surface of the substrate SUB from being transmitted to the first and second sensing transistors ST1 and ST2. In other words, the conductive pattern CPP may be a light blocking layer.

The conductive pattern CPP may be a sensing electrode which varies in self-capacitance depending on a touch generated by the user. When the touch is inputted to the conductive pattern CPP, the capacitance of a touched area of the conductive pattern CPP may vary. A predetermined voltage change resulting from the variation in capacitance is obtained through the read-out line ROL, whereby it is possible to determine whether a touch has been generated at a certain location.

As described above, in an exemplary embodiment of the invention, the conductive pattern CPP may be a light blocking layer for blocking light drawn from the rear surface of the substrate SUB, and may be a sensing electrode for sensing a touch of the user.

Hereinafter, the configuration of the touch sensing circuit TSC according to an exemplary embodiment of the invention will be described in a stacking sequence with reference to FIGS. 8 and 9.

A first buffer layer BFL1 may be provided on the substrate SUB. The first buffer layer BFL1 may prevent impurities from being diffused to the first and second sensing transistors ST1 and ST2. The first buffer layer BFL1 may be an inorganic insulating layer including inorganic material. In an exemplary embodiment, the first buffer layer BFL1 may include silicon nitride, silicon oxide, silicon oxynitride, or the like, for example. In the case where the first buffer layer BFL1 has a multilayer structure, the respective layers may include the same material as each other or different materials from each other. In another exemplary embodiment, the first buffer layer BFL1 may be omitted depending on the material of the substrate SUB or processing conditions.

The conductive pattern CPP may be provided on the first buffer layer BFL1. In an exemplary embodiment, the conductive pattern CPP may include conductive material, e.g., metal. The conductive pattern CPP may include one kind of metal or, alternatively, may include two or more kinds of metals, or an alloy of two or more kinds of metals. The conductive pattern CPP may be a light blocking layer which blocks light drawn from the rear surface of the substrate SUB, thus preventing the light from entering the first and second sensing transistors ST1 and ST2.

A second buffer layer BFL2 may be provided on the conductive pattern CPP. The second buffer layer BFL2 may include the same material as that of the first buffer layer BFL1, but the invention is not limited thereto.

The first and second sensing active patterns SACT1 and SACT2 may be provided on the second buffer layer BFL2. The first and second sensing active patterns SACT1 and SACT2 may include semiconductor material.

The second sensing drain electrode SDE2 coupled to a first end of the second sensing active pattern SACT2 may be coupled to the conductive pattern CPP through the fourth sensing contact hole SCH4 that passes through the second buffer layer BFL2. The first sensing source electrode SSE1 coupled to a first end of the first sensing active pattern SACT1 may be coupled to the conductive pattern CPP through the second sensing contact hole SCH2 that passes through the second buffer layer BFL2.

A gate insulating layer GI may be provided on the substrate SUB on which the first and second sensing active patterns SACT1 and SACT2 have been provided. The gate insulating layer GI may insulate the first and second sensing active patterns SACT1 and SACT2 from the first and second sensing gate electrodes SGE1 and SGE2.

The i−1-th sensing scan line SSi−1, the i-th sensing scan line SSi, and the first and second sensing gate electrodes SGE1 and SGE2 may be provided on the gate insulating layer GI. The first sensing gate electrode SGE1 may be unitary with the i−1-th sensing scan line SSi−1. The second sensing gate electrode SGE2 may be unitary with the i-th sensing scan line SSi.

First and second insulating layers IL1 and IL2 may be successively provided on the substrate SUB on which the i−1-th sensing scan line SSi−1, etc., is disposed.

The read-out line ROL may be provided on the second insulating layer IL2. The read-out line ROL may be coupled to the second sensing source electrode SSE2 through the third sensing contact hole SCH3 that successively passes through the gate insulating layer GI, and the first and second insulating layers IL1 and IL2.

A third insulating layer IL3 may be provided on the substrate SUB on which the read-out line ROL has been disposed.

A protective layer PSV may be provided on the third insulating layer IL3.

A pixel defining layer PDL may be provided on the protective layer PSV. The pixel defining layer PDL may be an organic insulating layer including organic material. In an exemplary embodiment, the organic material may be organic insulating material including at least one of a polyimide-based compound, a polyacryl-based compound, a fluoropolymer-based compound including Teflon, a polyorganosiloxane compound, a benzocyclobutene compound, a phenolic-based compound, an epoxy-based compound, a polyamide-based compound, a polyphenylene ether-based compound, and a polyphenylene sulfide-based compound, for example.

A second electrode CD may be provided on the pixel defining layer PDL. An encapsulation layer SLM may be provided on the second electrode CD.

Figure 10:
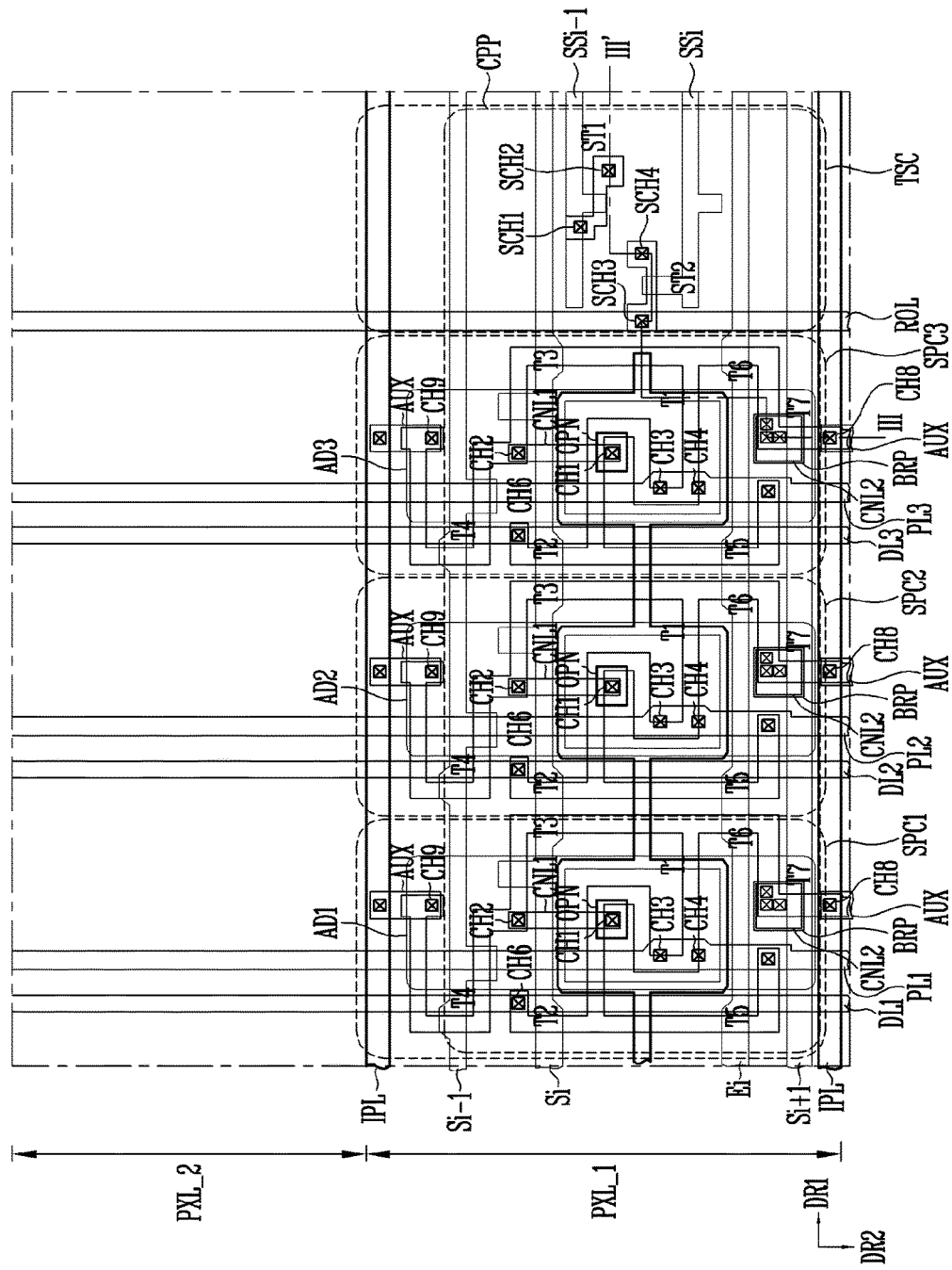
FIG. 10 is a plan view illustrating in detail the pixel shown in FIG. 3.
Figure 11:
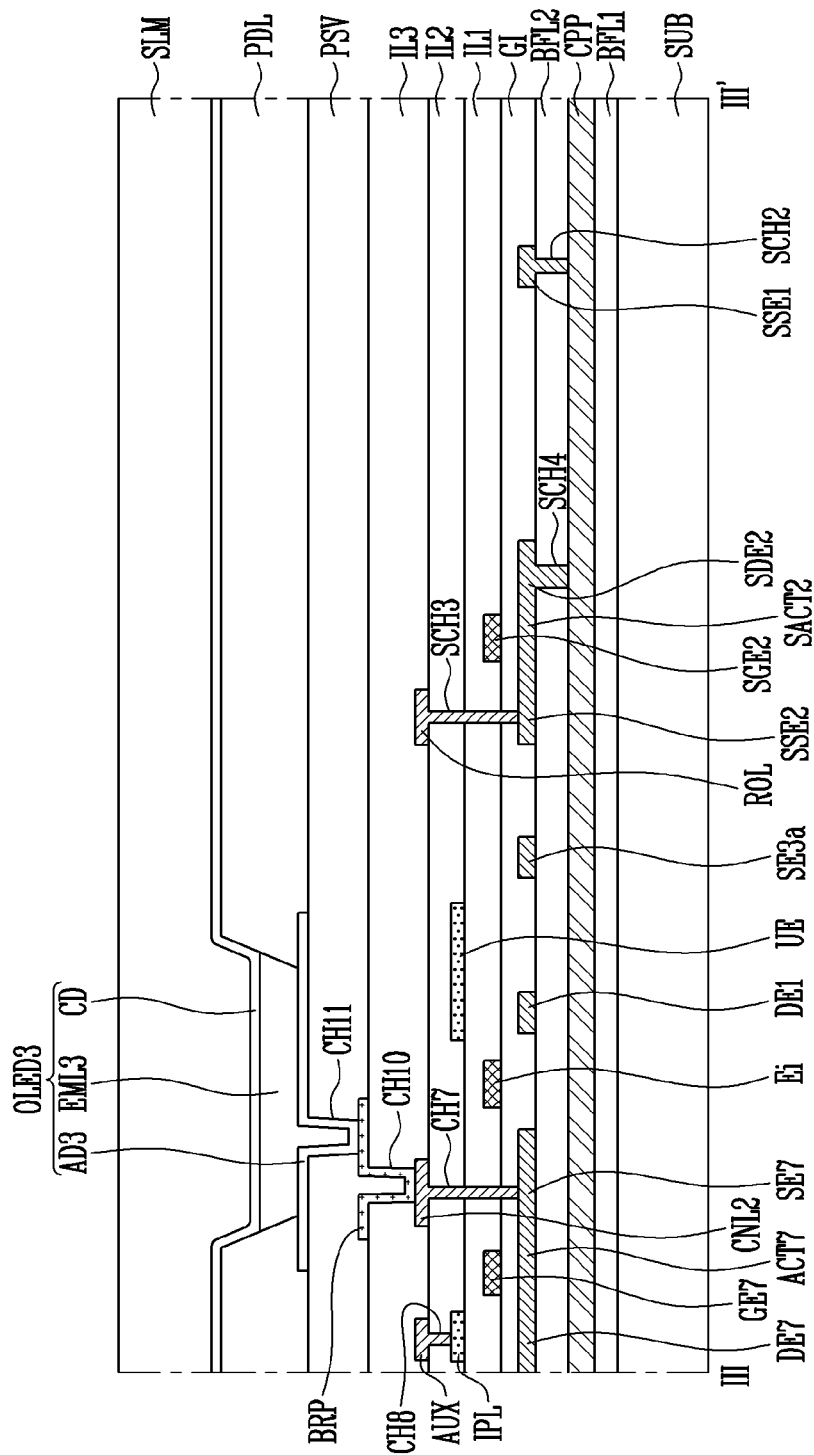
FIG. 11 is a cross-sectional diagram taken along line III-III' of FIG. 10.

FIG. 10 is a plan view illustrating in detail the pixel shown in FIG. 3. FIG. 11 is a cross-sectional view taken along line III-III' of FIG. 10.

In FIGS. 10 and 11, based on a single pixel PXL including three sub-pixels and a touch sensing circuit, the illustration is focused on three scan lines Si−1, Si, and Si+1, an emission control line Ei, three power lines PL1, PL2, and PL3, three data lines DL1, DL2, and DL3, an initialization power line IPL, two sensing scan lines SSi−1 and SSi, and a read-out line ROL which are coupled to the single pixel PXL.

In FIGS. 10 and 11, for the sake of description, a scan line disposed on the i−1-th row will be referred to as "i−1-th scan line Si−1", a scan line disposed on the i-th row will be referred to as "i-th scan line Si", a scan line disposed on the i+1-th row will be referred to as "i+1-th scan line Si+1", an emission control line disposed on the i-th row will be referred to as "emission control line Ei", a data line coupled to a first sub-pixel will be referred to as "first data line DL1", a data line coupled to a second sub-pixel will be referred to as "second data line DL2", a data line coupled to a third sub-pixel will be referred to as "third data line DL3", a power line coupled to a first sub-pixel will be referred to as "first power line PL1", a power line coupled to a second sub-pixel will be referred to as "second power line PL2", a power line coupled to a third sub-pixel will be referred to as "third power line PL3", and an initialization power line will be referred to as "initialization power line IPL". In addition, for the sake of explanation, a sensing scan line disposed on the i−1-th row will be referred to as "i−1-th sensing scan line SSi−1", a sensing scan line disposed on the i-th row will be referred to as "i-th sensing scan line SSi", and a read-out line will be referred to as "read-out line ROL".

In FIGS. 10 and 11, description of first to seventh transistors provided in each of the three sub-pixels will be focused on differences from those of the above-mentioned exemplary embodiments so as to avoid redundant description, and components which are not separately explained in the following description may comply with that of the preceding embodiments. The same reference numerals will be used to designate the same components, and similar reference numerals will be used to designate similar components. Furthermore, in FIGS. 10 and 11, description of first and second sensing transistors provided in the touch sensing circuit will be focused on differences from those of the above-mentioned exemplary embodiments so as to avoid redundant description, and components which are not separately explained in the following description may comply with that of the preceding embodiments. The same reference numerals will be used to designate the same components, and similar reference numerals will be used to designate similar components.

In FIGS. 10 and 11, second electrodes disposed on the first to third sub-pixels may correspond to a common layer provided over the entirety of the single pixel PXL, therefore, the same reference numeral will be used to designate the second electrodes.

Referring to FIGS. 3, 10, and 11, the display device in accordance with an exemplary embodiment of the invention may include a substrate SUB, a line unit, and pixels PXL.

The line unit may provide a signal to each pixel PXL and include scan lines Si−1, Si, and Si+1, data lines DL1, DL2, and DL3, an emission control line Ei, power lines PL1, PL2, and PL, an initialization power line IPL, sensing scan lines SSi−1 and SSi, and a read-out line ROL.

The scan lines Si−1, Si and Si+1 may include an i−1-th scan line Si−1, an i-th scan line Si, and an i+1-th scan line Si+1 which extend in the first direction DR1 of the substrate SUB and are successively arranged in the second direction DR2 intersecting the first direction DR1.

The emission control line Ei may extend in the first direction DR1 and be disposed between the i-th scan line Si and the i+1-th scan line Si+1 at a position spaced apart from the i-th scan line Si and the i+1-th scan line Si+1. An emission control signal may be applied to the emission contact line Ei.

The data lines DL1, DL2, and DL3 may include a first data line DL1, a second data line DL2, and a third data line DL3 which extend in the second direction DR2 and are successively arranged in the first direction DR1. A first data signal may be applied to the first data line DL1, a second data signal may be applied to the second data line DL2, and a third data signal may be applied to the third data line DL3.

The power lines PL1, PL2, and PL3 may include a first power line PL1, a second power line PL2, and a third power line PL3 which extend in the second direction DR2 and are successively arranged in the first direction DR1. A first power supply ELVDD (refer to FIG. 2) may be applied to the first to third power lines PL1, PL2 and PL3.

The initialization power line IPL may extend in the first direction DR1, and an initialization power supply Vint (refer to FIG. 2) may be applied thereto.

The sensing scan lines SSi−1 and SSi may include an i−1-th sensing scan line SSi−1 and an i-th sensing scan line SSi which extend in the first direction DR1 and are successively arranged in the second direction DR2.

The read-out line ROL may extend in the second direction DR2 and be spaced apart from the third power line PL3 by a predetermined distance. The read-out line ROL may be electrically coupled to an external sensing drive circuit (not shown).

Each pixel PXL may include first to third sub-pixels and a touch sensing circuit TSC. In an exemplary embodiment of the invention, the touch sensing circuit TSC may be provided in each pixel PXL, but the invention is not limited thereto. In an exemplary embodiment, the touch sensing circuit TSC may be provided in only some of the pixels PXL, taking into account the degree of integration of lines, for example.

The first sub-pixel may include a first sub-pixel circuit SPC1 which is coupled to the scan lines Si−1, Si, and Si+1 and the first data line DL1, and a first organic light-emitting diode (not shown) which is coupled to the first sub-pixel circuit SPC1. The second sub-pixel may include a second sub-pixel circuit SPC2 which is coupled to the scan lines Si−1, Si, and Si+1 and the second data line DL2, and a second organic light-emitting diode (not shown) which is coupled to the second sub-pixel circuit SPC2. The third sub-pixel may include a third sub-pixel circuit SPC3 which is coupled to the scan lines Si−1, Si, and Si+1 and the third data line DL3, and a third organic light-emitting diode OLED3 which is coupled to the third sub-pixel circuit SPC3.

The first sub-pixel may include a first light-emitting area R which emits light having a first color. The second sub-pixel may include a second light-emitting area G which emits light having a second color. The third sub-pixel may include a third light-emitting area B which emits light having a third color. The first organic light-emitting diode may include a 1-1-th electrode AD1 corresponding to the first light-emitting area R. The second organic light-emitting diode may include a 1-2-th electrode AD2 corresponding to the second light-emitting area G. The third organic light-emitting diode OLED3 may include a 1-3-th electrode AD3 corresponding to the third light-emitting area B.

Each of the first to third sub-pixel circuits SPC1, SPC2, and SPC3 may include first to seventh transistors T1 to T7, a storage capacitor Cst (refer to FIG. 5), an auxiliary coupling line AUX, first and second contact lines CNL1 and CNL2, and a bridge pattern BRP. In an exemplary embodiment of the invention, each of the first to third sub-pixel circuit SPC1, SPC2, and SPC3 may include first to seventh transistors T1 to T7 and a storage capacitor Cst, but the invention is not limited thereto. In an exemplary embodiment, each of the first to third sub-pixel circuits SPC1, SPC2, and SPC3 may include two transistors and a single storage capacitor, for example.

The touch sensing circuit TSC may be disposed in a sensing area SA of each pixel PXL. The touch sensing circuit TSC may include first and second sensing transistors ST1 and ST2.

Each pixel PXL may include a first area PXL_1 and a second area PXL_2. The first area PXL_1 may be a light-emitting area from which light is emitted. The second area PXL_2 may be a light transmitting area allowing light to pass therethrough.

The first to third sub-pixels may be disposed in the first area PXL_1. Particularly, the first to third light-emitting area R, G, and B may be disposed in the first area PXL_1. In this case, the first to third sub-pixel circuits SPC1, SPC2, and SPC3 may be disposed in the first area PXL_1. Since the first to third sub-pixel circuits SPC1, SPC2, and SPC3 are concentrically disposed in a predetermined area, e.g., the first area PXL_1, of the pixel PXL, a sufficient aperture ratio of the pixel PXL may be secured. Particularly, in the case where the display device in accordance with an exemplary embodiment of the invention is a transparent display device, the transmissivity of light drawn from the rear surface of the substrate SUB is increased because a sufficient aperture ratio of the pixel PXL is secured. Consequently, the image quality of the transparent display device may be enhanced.

The pixel PXL may include a conductive pattern CPP. The conductive pattern CPP may be disposed in the first area PXL_1, and may overlap the first to third sub-pixel circuits SPC1, SPC2, and SPC3 in a plan view.

In a plan view, the conductive pattern CPP may extend in the first direction DR1 and have a bar shape, but the invention is not limited thereto. In an exemplary embodiment, the conductive pattern CPP may be modified to have various shapes, so long as it can prevent light drawn from the rear surface of the substrate SUB from being transmitted to the active pattern of each of the first to seventh transistors T1 to T7 or the sensing active pattern of each of the first and second sensing transistors ST1 and ST2, for example.

In an exemplary embodiment, the conductive pattern CPP may include conductive material, e.g., metal. The conductive pattern CPP may include one kind of metal or, alternatively, may include two or more kinds of metals, or an alloy of two or more kinds of metals. As described above, the conductive pattern CPP may be a light blocking layer which blocks light drawn from the rear surface of the substrate SUB.

The conductive pattern CPP may be a sensing electrode which varies in self-capacitance depending on a touch generated by the user. The conductive pattern CPP may be electrically coupled with the first and second sensing transistors ST1 and ST2 of the touch sensing circuit TSC. When the second sensing transistor ST2 is turned on, the conductive pattern CPP and the read-out line ROL are electrically coupled with each other, whereby a signal outputted from the conductive pattern CPP may be transmitted to the external sensing circuit through the read-out line ROL. When the touch is inputted to the conductive pattern CPP, the capacitance of a touched area of the conductive pattern CPP may vary. Therefore, a predetermined voltage change resulting from the variation in capacitance is obtained through the read-out line ROL, so that the location of the touch of the user can be determined.

According to the above-mentioned exemplary embodiment, each pixel PXL may include the conductive pattern CPP disposed in the first area PXL_1, so that light drawn from the rear surface of the substrate SUB can be prevented from being transmitted to the first to third sub-pixel circuits SPC1, SPC2, and SPC3 and the touch sensing circuit TSC. As a result, the invention may prevent a change in element characteristics of the first to seventh transistors T1 to T7 of each of the first to third sub-pixel circuits SPC1, SPC2, and SPC3 and the first and second sensing transistors ST1 and ST2 of the touch sensing circuit TSC, thereby making it possible to embody a display device having improved reliability.

Furthermore, according to the foregoing embodiments, the conductive pattern CPP is electrically coupled with the touch sensing circuit TSC. Therefore, the invention may embody a display device capable of using the conductive pattern CPP as the sensing electrode.

Hereinafter, the configuration of the display device according to an exemplary embodiment of the invention will be described in a stacking sequence with reference again to FIGS. 10 and 11.

A first buffer layer BFL1 may be provided on the substrate SUB.

The conductive pattern CPP may be provided on the first buffer layer BFL1. Here, the conductive pattern CPP may be provided on the substrate SUB over the entirety of each pixel PXL.

A second buffer layer BFL2 may be provided on the conductive pattern CPP.

The active pattern and the sensing active pattern may be provided on the second buffer layer BFL2. The active pattern may include first to seventh active patterns ACT1 to ACT7 (refer to FIG. 5). The sensing active pattern may include first and second sensing active patterns SACT1 and SACT2 (refer to FIG. 8).

A second sensing drain electrode SDE2 coupled to a first end of the second sensing active pattern SACT2 may be coupled to the conductive pattern CPP through a fourth sensing contact hole SCH4 that passes through the second buffer layer BFL2. A first sensing source electrode SSE1 coupled to a first end of the first sensing active pattern SACT1 may be coupled to the conductive pattern CPP through a second sensing contact hole SCH2 that passes through the second buffer layer BFL2.

A gate insulating layer GI may be provided on the substrate SUB on which the active pattern, etc., is provided.

The scan lines Si−1, Si, and Si+1, the sensing scan lines SSi−1 and SSi, the emission control line Ei, first to seventh gate electrodes GE1 to GE7 (refer to FIG. 5), a first sensing gate electrode SGE1 (refer to FIG. 8), and a second sensing gate electrode SGE2 may be provided on the gate insulating layer GI. Here, the first gate electrode GE1 may be a lower electrode LE (refer to FIG. 5) of a storage capacitor Cst (refer to FIG. 5) of each of the first to third sub-pixel circuits SPC1, SPC2, and SPC3. The scan line Si−1, Si, and Si+1 and the sensing scan lines SSi−1 and SSi may be provided in the same layer and provided through the same process.

A first insulating layer IL1 may be provided on the substrate SUB on which the scan lines Si−1, Si, and Si+1 have been disposed.

The initialization power line IPL and an upper electrode UE of the storage capacitor Cst may be provided on the first insulating layer IL1.

A second insulating layer IL2 may be provided on the substrate SUB on which the initialization power line IPL, etc., has been provided.

The first to third data lines DL1, DL2, and DL3, the first to third power lines PL1, PL2, and PL3, the first and second contact lines CNL1 and CNL2, the auxiliary coupling line AUX, and the read-out line ROL may be provided on the second insulating layer IL2.

The first to third data lines DL1, DL2, and DL3 and the read-out line ROL may be provided in the same layer and provided through the same process.

The second contact line CNL2 may be coupled to the sixth transistor T6 and the seventh transistor T7 of each of the first to third sub-pixel circuits SPC1, SPC2, and SPC3 through a seventh contact hole CH7 that successively passes through the gate insulating layer GI, the first and second insulating layers IL1 and IL2.

The read-out line ROL may be coupled to a second sensing source electrode SSE2 of the second sensing transistor ST2 through a third sensing contact hole SCH3 that successively passes through the gate insulating layer GI, and the first and second insulating layers IL1 and IL2.

A third insulating layer IL3 may be provided on the substrate SUB on which the first to third data lines DL1, DL2, and DL3 have bee provided.

The bridge pattern BRP may be provided on the third insulating layer IL3. The bridge pattern BRP may be coupled to the second contact line CNL2 through a tenth contact hole CH10 that passes through the third insulating layer IL3.

A protective layer PSV may be provided on the substrate SUB on which the bridge pattern BRP has been provided.

The 1-1-th electrode AD1, the 1-2-th electrode AD2, and the 1-3-th electrode AD3 may be provided on the protective layer PSV. Each of the 1-1-th to 1-3-th electrodes AD1, AD2, and AD3 may be coupled to the corresponding bridge pattern BRP through an eleventh contact hole CH11 passing through the protective layer PSV. Since the bridge pattern BRP is coupled to the second contact line CNL2 through the tenth contact hole CH10, each of the 1-1-th to 1-3-th electrodes AD1, AD2, and AD3 may be eventually coupled to the corresponding sixth transistor T6 and the corresponding seventh transistor T7 through the corresponding bridge pattern BRP and the corresponding second contact line CNL2.

A pixel defining layer PDL suitable for defining the first to third light-emitting areas R, G, and B may be provided on the substrate SUB on which the 1-1-th to 1-3-th electrodes AD1, AD2, and AD3 have been disposed. The pixel defining layer PDL may expose respective upper surfaces of the 1-1-th to 1-3-th electrode AD1, AD2, and AD3 and protrude from the substrate SUB along the periphery of the first to third light-emitting areas R, G, and B.

A first light-emitting layer EML1 (refer to FIG. 6) and a second light-emitting layer (not shown) may be respectively provided in the first and second light-emitting areas R and G enclosed by the pixel defining layer PDL. A third light-emitting layer EML3 may be provided in the third light-emitting area B enclosed by the pixel defining layer PDL.

The first light-emitting layer EML1 may be disposed on an exposed surface of the 1-1-th electrode AD1. The first light-emitting layer EML1 may have a multilayer thin-film structure including a light generation layer ("LGL") which generates light having the first color. In an exemplary embodiment, the first light-emitting layer EML1 may include a hole injection layer ("HIL") into which holes are injected, a hole transport layer ("HTL") which has excellent hole transportation performance and restrains movement of electrons that have not been coupled with holes in the LGL and thus increases chances of recombination between holes and electrons, the LGL which emits light by recombination between injected electrons and holes, a hole blocking layer ("HBL") which restrains movement of holes that have not been coupled with electrons in the LGL, an electron transport layer ("ETL") which is provided to smoothly transport electrons to the LGL, and an electron injection layer ("EIL") into which electrons are injected, for example.

The second light-emitting layer may be disposed on an exposed surface of the 1-2-th electrode AD2. The second light-emitting layer may have a multilayer thin-film structure including an LGL which generates light having the second color. In an exemplary embodiment, the second light-emitting layer may include an HIL into which holes are injected, an HTL which has excellent hole transportation performance and restrains movement of electrons that have not been coupled with holes in the LGL and thus increases chances of recombination between holes and electrons, the LGL which emits light by recombination between injected electrons and holes, an HBL which restrains movement of holes that have not been coupled with electrons in the LGL, an ETL which is provided to smoothly transport electrons to the LGL, and an EIL into which electrons are injected, for example.

The third light-emitting layer EML3 may be disposed on an exposed surface of the 1-3-th electrode AD3. The third light-emitting layer EML3 may have a multilayer thin-film structure including an LGL which generates light having the third color. In an exemplary embodiment, the third light-emitting layer EML3 may include an HIL into which holes are injected, a HTL which has excellent hole transportation performance and restrains movement of electrons that have not been coupled with holes in the LGL and thus increases chances of recombination between holes and electrons, the LGL which emits light by recombination between injected electrons and holes, an HBL which restrains movement of holes that have not been coupled with electrons in the LGL, an ETL which is provided to smoothly transport electrons to the LGL, and an EIL into which electrons are injected, for example.

A second electrode CD may be provided on the first and second light-emitting layer and the third light-emitting layer EML3.

An encapsulating layer SLM covering the second electrode CD may be provided on the second electrode CD.

The display device in accordance with an exemplary embodiment of the invention may be employed in various electronic devices. In an exemplary embodiment, the display device may be applied to various electronic devices such as a television, a notebook computer, a cellular phone, a smartphone, a smartpad ("PD"), a portable multimedia player ("PMP"), a personal digital assistant ("PDA"), a navigation device, various kinds of wearable devices such as a smartwatch, etc., for example.

Various exemplary embodiments of the invention may provide a display device including a conductive pattern so that external incident light is blocked, whereby the reliability of the display device may be enhanced. In addition, various exemplary embodiments of the invention may provide a display device capable of using the conductive pattern as a sensing electrode.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:

1. A display device comprising:
   a substrate including a pixel area, and a peripheral area enclosing at least one side of the pixel area;

a plurality of pixels provided in the pixel area, each of the plurality of pixels comprising a light-emitting element which emits light, a pixel circuit which drives the light-emitting element, and a sensing unit which senses a touch of a user; and a conductive pattern which is disposed between the substrate and the pixel circuit and which overlaps the pixel circuit in a plan view, the conductive pattern blocks light drawn into a rear surface of the substrate from being transmitted to the pixel circuit, wherein the sensing unit is electrically connected to the conductive pattern.

2. The display device according to claim 1, wherein the conductive pattern comprises a sensing electrode which changes in capacitance in response to a touch of a user.

3. The display device according to claim 2, wherein the sensing unit overlaps the conductive pattern in the plan view.

4. The display device according to claim 1, wherein the conductive pattern comprises a light blocking layer which blocks light from being drawn from a rear surface of the substrate on which the pixel circuit is not disposed.

5. A display device comprising:
a substrate including a pixel area, and a peripheral area enclosing at least one side of the pixel area;
a plurality of pixels provided in the pixel area, each of the plurality of pixels comprising a light-emitting element which emits light, a pixel circuit which drives the light-emitting element, and a sensing unit which senses a touch of a user;
a conductive pattern which is disposed between the substrate and the pixel circuit and which overlaps the pixel circuit in a plan view, the conductive pattern comprises a sensing electrode which changes in capacitance in response to a touch of a user;
a scan line which transmits a scan signal to each of the plurality of pixels;
a data line which transmits a data signal to each of the plurality of pixels;
a sensing scan line which is disposed in the same layer as the scan line, and which drives the sensing unit; and
a read-out line which is disposed in the same layer as the data line, and which acquires the change in the capacitance of the conductive pattern
wherein the sensing unit is electrically connected to the conductive pattern.

6. The display device according to claim 5, wherein the read-out line is electrically connected to the conductive pattern.

7. The display device according to claim 6, wherein the sensing unit comprises a sensing transistor which is connected to the sensing scan line and the read-out line and which senses the touch of the user.

8. The display device according to claim 7, wherein the sensing transistor comprises:
a sensing active pattern disposed on the substrate;
a sensing gate electrode disposed on the sensing active pattern; and
a sensing source electrode and a sensing drain electrode connected to the sensing active pattern,
wherein the sensing gate electrode is unitary with the sensing scan line.

9. The display device according to claim 8, wherein the conductive pattern overlaps the sensing active pattern in the plan view and blocks light from being transmitted from a rear surface of the substrate to the sensing active pattern.

10. The display device according to claim 8, further comprising:

a buffer layer which is disposed between the conductive pattern and the sensing active pattern, and in which a first contact hole through which a portion of the conductive pattern is exposed is defined.

11. The display device according to claim 10, further comprising:
an insulating layer which is disposed between the sensing active pattern and the read-out line, and in which a second contact hole through which a portion of the sensing active pattern is exposed is defined.

12. The display device according to claim 11, wherein one of the sensing source electrode and the sensing drain electrode is electrically connected to the conductive pattern through the first contact hole, and a remaining one thereof is electrically connected to the read-out line through the second contact hole.

13. The display device according to claim 5, wherein the pixel circuit comprises:
a first transistor connected to the scan line and the data line; and
a second transistor which is connected to the first transistor and which drives the light-emitting element.

14. The display device according to claim 13, wherein each of the first and second transistors comprises:
an active pattern provided over the conductive pattern disposed over the substrate;
a gate electrode disposed on the active pattern; and
a source electrode and a drain electrode connected to the active pattern.

15. The display device according to claim 14, wherein the conductive pattern overlaps the active pattern of each of the first and second transistors in the plan view.

16. The display device according to claim 15, wherein the conductive pattern blocks light from being transmitted from a rear surface of the substrate to the active pattern.

17. The display device according to claim 13, wherein the light-emitting element comprises:
a first electrode disposed on the substrate and coupled to the second transistor;
a light-emitting layer disposed on the first electrode; and
a second electrode disposed on the light-emitting layer.

18. The display device according to claim 1, wherein each of the plurality of pixels comprises a light-emitting area from which the light is emitted and a light transmitting area which is provided on at least one side of the light-emitting area and which passes light therethrough.

19. The display device according to claim 18, wherein the pixel circuit is not provided in the light transmitting area.

20. A display device comprising:
a substrate including a pixel area, and a peripheral area enclosing at least one side of the pixel area;
a plurality of pixels provided in the pixel area, each of the plurality of pixels comprising a light-emitting element which emits light, a pixel circuit which drives the light-emitting element, and a sensing unit which senses a touch of a user; and
a light blocking layer which is disposed between the substrate and the pixel circuit and which blocks light drawn into a rear surface of the substrate from being transmitted to the pixel circuit;
wherein the sensing unit is provided in the pixel area and electrically connected to the light blocking layer,
wherein the light blocking layer comprises a sensing electrode which changes in capacitance in response to the touch of the user, and overlaps each of the pixel circuit and the sensing unit in a plan view.

* * * * *